(12) United States Patent
Giedd

(10) Patent No.: US 6,489,616 B2
(45) Date of Patent: Dec. 3, 2002

(54) DOPED, ORGANIC CARBON-CONTAINING SENSOR FOR INFRARED DETECTION AND A PROCESS FOR THE PREPARATION THEREOF

(75) Inventor: Ryan E. Giedd, Springfield, MO (US)

(73) Assignee: The Board of Governors of Southwest Missouri State University, Springfield, MO (US)

(*) Notice: Subject to any disclaimer, the term of this patent is extended or adjusted under 35 U.S.C. 154(b) by 24 days.

(21) Appl. No.: 09/811,908

(22) Filed: Mar. 19, 2001

(65) Prior Publication Data

US 2002/0134939 A1 Sep. 26, 2002

(51) Int. Cl.[7] .................................... G01J 5/20
(52) U.S. Cl. .............. 250/338.1; 250/330; 250/332
(58) Field of Search ................ 250/338.1, 338.3, 250/339.14, 340, 330, 332

(56) References Cited

U.S. PATENT DOCUMENTS

| | | |
|---|---|---|
| 3,693,011 A | 9/1972 | De Vaux et al. |
| 4,371,861 A | 2/1983 | Abdelrahman et al. |
| 5,260,225 A | 11/1993 | Liu et al. |
| 5,286,976 A | 2/1994 | Cole |
| 5,288,649 A | 2/1994 | Keenan |
| 5,300,915 A | 4/1994 | Higashi et al. |
| 5,505,093 A | 4/1996 | Giedd et al. |
| 5,629,665 A | 5/1997 | Kaufmann et al. |
| 5,753,523 A | 5/1998 | Giedd et al. |
| 5,900,799 A | 5/1999 | Morris |
| 6,080,987 A | 6/2000 | Belcher et al. |
| 6,160,257 A | 12/2000 | Deb |
| 6,320,189 B1 * | 11/2001 | Ouvrier-Buffet et al. 250/338.4 |

OTHER PUBLICATIONS

N. Capps et al. "Tailoring Polymer Properties with Ion Beams" Cahners Semiconductor International, Jul. 2000, 10 pages.
P. Marasco et al. "Uncooled Infrared Sensor Performance" Proc. SPIE, vol. 2020 (Nov. 1993) pp. 363–378.
T. P. Nguyen et al. "Studies of Polyparaphenylene/Aluminum Interface" Synthetic Metals, vol. 38 (1990) pp. 69–76.

* cited by examiner

*Primary Examiner*—Constantine Hannaher
*Assistant Examiner*—Tim Moran
(74) *Attorney, Agent, or Firm*—Senniger, Powers, Leavitt & Roedel

(57) ABSTRACT

The present invention is directed to an uncooled, infrared detector which includes a sensor having an amorphous surface layer containing organic carbon and a high dopant concentration which possesses an improved temperature coefficient of resistivity, as well as improved responsivity, and which may be patterned to form a focal plane array by means of common microlithographic techniques. The present invention is additionally directed to an "ion beam mixing" process for preparing the present infrared sensor.

84 Claims, 8 Drawing Sheets

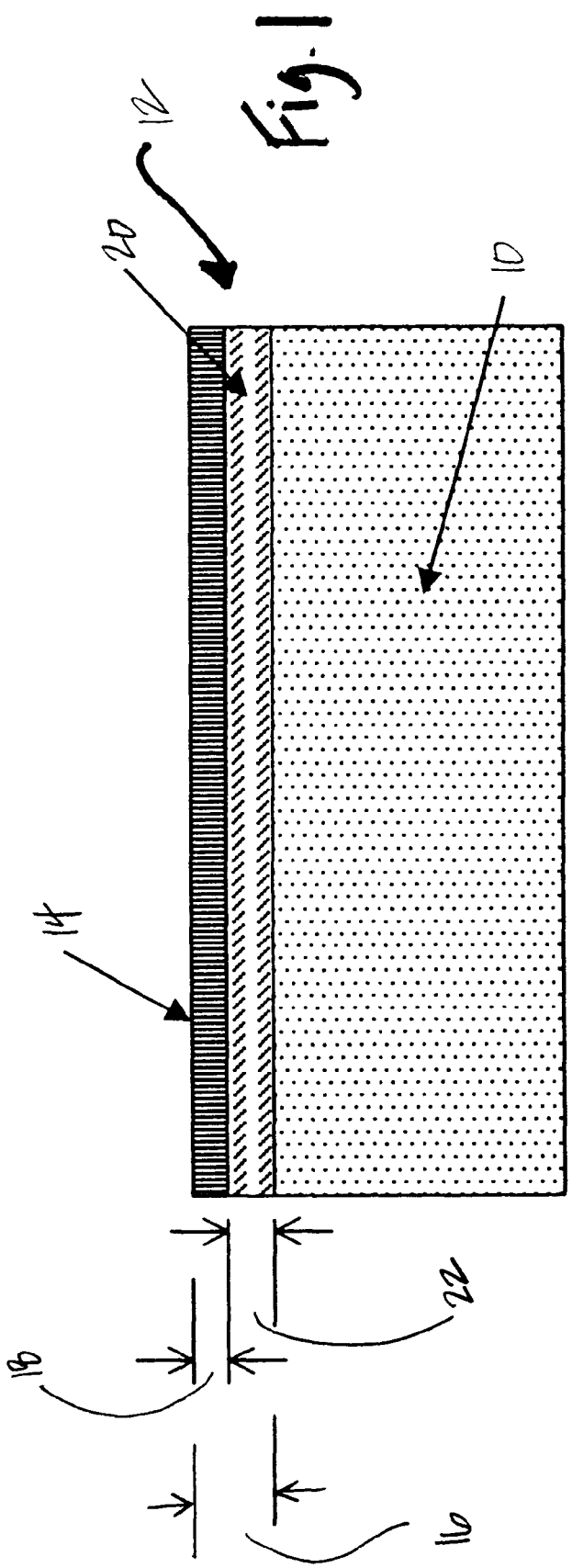

DOPED, ORGANIC CARBON-CONTAINING SENSOR FOR INFRARED DETECTION AND A PROCESS FOR THE PREPARATION THEREOF

BACKGROUND OF THE INVENTION

The present invention is generally directed to an infrared detector, as well as to a process for the preparation thereof, which is suitable for use without the need of a cooling device. More specifically, the present invention is directed to an uncooled, infrared detector having a thermally isolated doped, organic carbon-containing sensor, formed by means of an implantation process.

Infrared ("IR") or thermal imaging systems, or imaging systems employing infrared detectors or sensors, are important alternatives to visible light systems in applications where visible signals are either not available or not appropriate. Infrared systems can employ a single detector, such as in scientific instruments (e.g., IR spectrometers), or multiple detectors can be used in combination to form an array (e.g., a focal plane array or "FPA") for use in military applications (e.g., imaging systems for individual soldiers or vehicles, weapons targeting systems or battlefield surveys) or civilian applications (e.g., driving aids, such as "heads-up" displays in vehicles, thermal imaging for energy efficiency audits, active sensors in security and safety systems and fire detection).

In general, infrared sensors or detectors operate by converting IR photons and energy into electrical signals. Infrared sensors or detectors can be divided into two broad categories. The first category, photon detectors, involve the direct interaction between the incident IR photons and electrons. These detectors are highly efficient because of the direction connection between the incident IR photons and the measured electrical response. Common examples of such detectors include photoconductive, photovoltaic, MIS and Schottky barrier devices.

The second category IR detectors, thermal detectors, involve the mediation of the interaction between the photons and electrons by phonons (i.e., thermal energy). More specifically, thermal detectors detect incident energy by means of an IR photon-temperature change-property change process. The detectors are made electrically sensitive to a property that is a function of temperature. A finite temperature change in the detector occurs as it absorbs IR radiation. This temperature change induces a property change in the material that can be measured by a corresponding electrical signal.

Thermal detectors are differentiated by the type of electrical signal that results from the temperature change. For example, pyro-electric sensors develop excess charge when exposed to temperature changes. Thermocouple sensors acquire a finite voltage, as a function of the temperature, across the sensor element. Bolometric sensors change electrical resistance as a function of temperature. Finally, capacitive sensors change dielectric constant as a function of temperature.

A number of features are important to the performance of an IR detector, such as a bolometer. For example, preferably the IR detector has a large responsivity. For bolometric sensors, it is recognized that typically responsivity is maximized when the detector has a large temperature coefficient of resistance ("TCR"), a small heat capacity (which enables the incident IR energy to result in a maximum temperature change), and a large thermal conductivity internal to the sensor. In the case of a FPA, preferably each individual sensor, or pixel, has a weak thermal link from the background or substrate to which it is attached, so that it can recover from a thermal event in a finite time. Additionally, to ensure the pixel reaches equilibrium before it is sampled by the electronics of the imaging system, a time constant limitation should also be met. More specifically, the thermal time constant, defined as the ratio of the heat capacity to the internal thermal conductance, should be kept below some fraction of the "dwell time," which is generally defined as the time required to measure the electrical response of each pixel of the FPA.

Noise characteristics, or more specifically low noise characteristics, are another important feature for IR detectors. With respect to the noise limitation for focal plane arrays, it is recognized that this is related to the resistivity of each pixel or sensor. (See, e.g., *Uncooled Infrared Sensor Performance,* Infrared Technology, Proc. of SPIE, vol. 2020, 1993.) In some applications, for example, a resistance of 50,000 ohms is considered optimum for purposes of achieving the desired noise characteristics.

A high degree of uniformity is also important. In general, pixel or sensor spacial response uniformity has to do with how each pixel in the array compares to the others in terms of performance, and more specifically in terms of resistivity. Pixel uniformity is an important factor, for example, in achieving optimum performance in the overall array.

In addition to the above-noted performance features, it is also desirable for an IR detector to be easily fabricated, for example by means of standard semiconductor manufacturing techniques. Furthermore, it is also desirable, in many applications, for the detector to be capable of operation without the need of a temperature control or temperature regulating device of some kind; that is, it is desirable for the detector to be "uncooled," or capable of operating at room temperature, because a cooling device adds weight and cost to the overall instrument.

Many approaches have been proposed to-date in an attempt to address each of the above-noted features. For example, in an attempt to develop IR detectors having improved responsivity and thermal isolation, many have proposed the use of bridge or cell structures, typically fabricated from polysilicon, upon which or from which a detector element is formed, either through doping of the bridge material or through deposition of a separate material such as a permalloy (e.g., NiFe) on the bridge. (see, e.g., U.S. Pat. Nos. 5,300,915; 5,260,225; 5,288,649; and 5,286, 976.) However, such approaches fall short for a number of reasons, including difficulties in processing or preparation, poor uniformity or poor responsivity (e.g., poor TCR values). For example, it is extremely difficult to produce uniform films of materials commonly used for focal plane arrays, particularly uncooled FPAS, such as vanadium oxides ($VO_x$) and barium strontium titanate ("BST"), which typically have property variations of 10% or more.

Additionally, most technologies heretofore developed involve hybrid structures which present many difficulties in terms of being easy to manufacture, particularly in terms of reliability or reproducibility. Furthermore, while monolithic detectors or focal plane arrays have also been disclosed which have good uniformity (see, e.g., U.S. Pat. Nos. 5,900,799 and 5,629,665), in some instances high responsivity is achieved only by means of employing a temperature control device (see, e.g., U.S. Pat. No. 5,900,799).

Accordingly, a need continues to exist for an IR sensor material having, compared to existing materials, improved performance characteristics, as well as a process for the preparation thereof. Ideally, the sensor would be comprised of a material which is capable of forming a free-standing bridge-like structure having enhanced flexibility and strength, and the process would allow existing microlithographic or photolithographic techniques to be used to prepare the sensor, and preferably an array of such sensors.

SUMMARY OF THE INVENTION

Among the several objects of the present invention, therefore, is the provision of infrared detector, and a process for the preparation thereof, which employs a sensor having improved responsivity, including an improved temperature coefficient of resistivity, heat capacity and thermal conductivity; the provision of such a sensor having improved flexibility and strength, and which is capable of forming a free-standing, bridge-like structure; the provision of such a sensor which can be easily fabricated into a focal plane array using standard microlithographic techniques; the provision of such an array which has increased uniformity; the provision of such an array which has a high fill factor; the provision of such an array which can be used without the need of a temperature control device; and, the provision of such an array which enables the preparation of an improved imaging system, the system having decreased thermal noise and optimum resistivity.

Briefly, therefore, the present invention is directed to an infrared detector. The detector comprises (i) a substrate; (ii) a sensor having a segment thermally isolated from the substrate and a resistivity which varies as a function of temperature, the segment comprising an amorphous layer containing organic carbon and a dopant, the concentration of the dopant in the amorphous layer being at least about $1 \times 10^{20}$ atoms/cm$^3$, the dopant being aluminum, an element having an atomic number greater than 18, or a mixture thereof; and, (iii) contacts electrically connected to the segment, the segment being energizable via said contacts.

The present invention is further directed to an infrared detector. The detector comprises (i) a substrate; (ii) a sensor having a segment thermally isolated from the substrate and a resistivity which varies as a function of temperature, the segment comprising an amorphous layer containing organic carbon and a dopant, the sensor having a responsivity of at least about 5000 V/W; and, (iii) contacts electrically connected to the segment, the segment being energizable via said contacts.

The present invention is still further directed to an infrared detector. The detector comprises (i) a substrate; (ii) a sensor having a segment thermally isolated from the substrate and a resistivity which varies as a function of temperature, the segment comprising an amorphous layer containing organic carbon and a dopant, the sensor having a temperature coefficient of resistivity of at least about 2%/K; and, (iii) contacts electrically connected to the segment, the segment being energizable via said contacts.

The present invention is still further directed to an infrared detector. The detector comprises (i) a substrate; (iii) a sensor having a segment thermally isolated from the substrate and a resistivity which varies as a function of temperature, the segment comprising an ion beam mixed layer containing organic carbon and a dopant other than carbon, the concentration of the dopant in the ion beam mixed layer being at least about $1 \times 10^{20}$ atoms/cm$^3$, the ion beam mixed layer being formed by ion beam mixing of a target layer and an organic layer wherein the target layer comprises a source of the dopant; and, (iii) contacts electrically connected to the segment, the segment being energizable via said contacts.

The present invention is still further directed to processes for detecting infrared radiation using such detectors. In particular, the present invention is directed to a process for detecting infrared radiation comprising (i) passing an electrical current through a sensor of an infrared detector, the sensor having a segment thermally isolated from a substrate of the detector and a resistivity which varies as a function of temperature, the segment comprising an amorphous layer containing organic carbon and a dopant, the concentration of the dopant in the amorphous layer being at least about $1 \times 10^{20}$ atoms/cm$^3$, the dopant being aluminum, an element having an atomic number greater than 18, or a mixture thereof; and, (ii) detecting a resistivity change in the sensor caused by the absorption of heat from infrared radiation impinging the sensor.

The present invention is still further directed to processes for preparing such infrared detectors. In particular, the present invention is directed to a process comprising (i) forming an organic layer on a substrate; (ii) forming a target layer comprising a dopant on the organic layer; and, (iii) contacting the target layer with an ion beam to form an infrared sensor on the substrate, the sensor having a segment thermally isolated from the substrate and a resistivity which varies as a function of temperature, the segment comprising an ion beam mixed layer containing organic carbon derived from the organic layer and a dopant other than carbon from the target layer, the concentration of the dopant in the ion beam mixed layer being at least about $10^{20}$ atoms/cm$^3$.

Other objects and features of this invention will be in part apparent and in part pointed out hereinafter.

BRIEF DESCRIPTION OF THE DRAWINGS

FIG. 1 is a schematic, cross-sectional view generally depicting the detector of the present invention, prior to bridge formation.

With respect to the Figures, it is to be noted that corresponding reference characters indicate corresponding parts throughout the several views of the drawings. Additionally, it is to be noted that the features shown are for descriptive or illustrative purposes only, and are therefore not shown in actual or relative scale.

DETAILED DESCRIPTION OF THE PREFERRED EMBODIMENTS

Figure 2B:
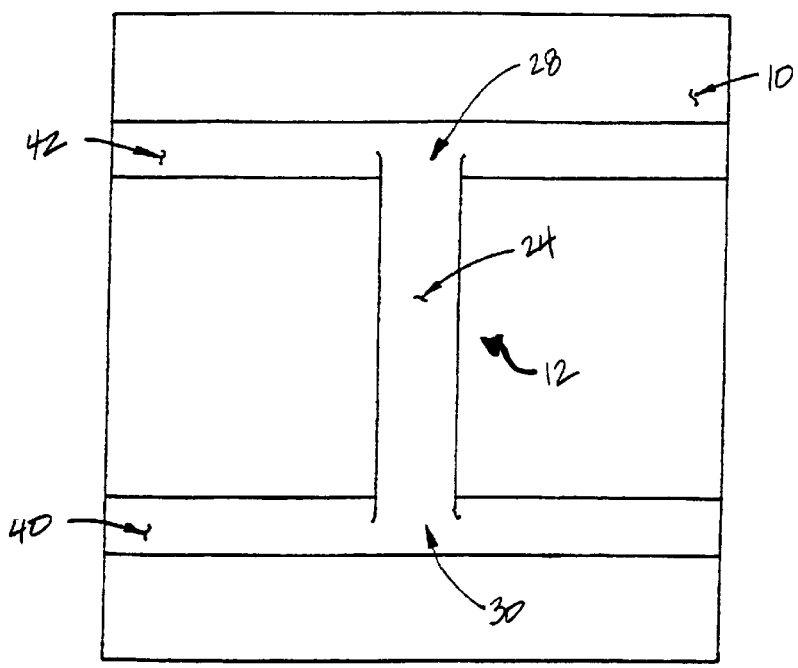
FIGS. 2A and 2B are schematic views generally depicting the detector of the present invention after bridge formation, 2A illustrating a side view and 2B illustrating a top plan view.

In accordance with the present invention, an improved infrared detector comprising a substrate and a conductive sensor, which is capable of absorbing heat from impinging infrared radiation and exhibiting a property change as a result thereof (such as in the case of pyro-electric, thermocouple, bolometric or capacitive sensors), has been prepared. The present detector possesses increased responsivity and, when fabricated into an imaging system (e.g., an infrared camera), acts to reduce noise. Additionally, the sensor has been found to have increased strength and flexibility, compared to existing inorganic, metal alloys or carbon-metal alloys, such that it may be used to form a free-standing, bridge-like structure (i.e., a bridge which does not need an additional supporting structure).

The present sensor, as further described herein, enables an IR detector to be operated at room temperature (i.e., without the need of a temperature control or cooling device). Additionally, the sensor can advantageously be manufactured to produce arrays of detectors (e.g., focal plane arrays), which are highly uniform by means of traditional photolithography or microlithography techniques, which is a significant improvement over existing methods. Finally, a detector comprising the present sensor can be operated passively, a passive imaging system having a significant advantage over an active system because it cannot be as easily detected.

Detector

Referring now to FIG. 1, an improved infrared detector of the present invention is generally illustrated, the detector comprising a substrate 10 and a sensor, generally indicated at 12, which comprises an amorphous layer 14. The amorphous layer comprises or contains organic carbon, typically derived from an organic polymer, and a dopant which affects the conductivity or resistivity properties of the sensor. As further described herein, this layer typically contains a concentration of a dopant (e.g., aluminum, an element having an atomic number of greater than 18, or a mixture thereof) which is sufficiently high (e.g., at least about $1\times10^{20}$ atoms/cm$^3$) to enable the preparation of an infrared detector having a significantly improved performance over existing infrared detectors, such as those consisting only of a substrate and, for example, an ion-implanted layer, the present sensor in some embodiments exhibiting an increased responsivity of about 10%, 15%, 25%, 35% or more (relative to ion-implanted only analogs). Additionally, the present sensor has been found in some embodiments to exhibit a significantly reduced resistivity (e.g., at least about 75%, 85%, 95% or more, relative to ion-implanted only analogs).

It is to be noted that this amorphous layer of the sensor may generally be described as an "alloy"; that is, this layer may be described as a composition or a mixture comprising organic carbon and a dopant (as further described herein). Additionally, it is to be noted that in some embodiments the amorphous layer may additionally comprise local regions of crystallinity (e.g., crystallites or aggregates), the amorphous layer thus being the "continuous phase" in which these crystalline regions are dispersed.

It is to be further noted that "organic carbon" generally refers to carbon derived from an organic source, typically an organic polymer or a polymer having as a primary component carbon (e.g., at least about 50 wt. %, 60 wt. %, 70 wt. %, 80 wt. %, 90 wt. % or more). As further described herein, the polymer from which the organic carbon is derived may be, for example, hydrogen- or halogen-depleted, which generally means the organic carbon component of this "alloy" may be in the form of a carbon backbone of the polymer from which it is derived, or a fragment thereof, and may possess, to a limited degree, carbon-hydrogen and/or carbon-halogen bonds.

Generally speaking, the sensor 12 has a thickness 16 which acts to optimize performance (as further described herein), as well as enable any subsequent manufacturing or fabrication processes to be easily achieved. For example, if the sensor is to be photolithographically patterned, thickness is an important parameter to be controlled, particularly when an inflexible and nonporous substrate is involved, because sensors which are too thick may not possess the necessary solvent resistance and therefore will blister during photoresist baking for example. In addition, thickness can influence parameters such as ambient stability. Typically, however, the overall thickness 16 of the sensor 12 ranges for example from at least about several tens of angstroms (e.g., about 50, 75, 100), to a few hundred angstroms (e.g., about 250, 500, 750) or more (e.g., about 1000, 1250, 1500, 1750 or more), as measured from the sensor surface toward the substrate. In some preferred embodiments, the thickness ranges from about 250 to about 1500 angstroms, or from about 500 to about 1000 angstroms.

In one embodiment, the sensor 12 comprises an amorphous layer 14 which extends the full depth or thickness of the film; that is, in one embodiment the entire sensor comprises organic carbon and a dopant, such that the sensor thickness 16 and the thickness 18 of the amorphous layer 14 are about equal. Alternatively, however, this amorphous layer may extend to some depth or thickness which is less than about equal to the thickness of the sensor. In such instances, the amorphous layer may extend over less than about 20%, 40%, 60%, 80% 90% or even about 95% of the depth or thickness of the sensor. Accordingly, the amorphous layer 14 may have a thickness or depth 18 which ranges for example from about 25, 50, 75 or even 100 angstroms up to about 200, 400, 600, 800, 1000 angstroms or more, as measured from the sensor surface toward the substrate. Typically, however, the amorphous layer 14 has a thickness 18 ranging from about 50 to about 750 angstroms, from about 75 to about 500 angstroms, or from about 100 to about 250 angstroms (the layer extending for example over about 10% to about 90%, from about 20% to about 80%, or from about 40% to about 60% of the total sensor thickness).

For those embodiments wherein the amorphous layer 14 does not extend over the depth or thickness 16 of the sensor 12, the sensor may additionally comprise a second layer 20, disposed between the amorphous layer 14 and the substrate 10, which as further described herein may have significantly different character or properties than the amorphous layer. More specifically, this second layer 20 is typically substantially free of the dopant of the amorphous layer 14, having for example a dopant concentration which is less than about 10, 5, 2, 1 atomic percent or less (e.g., 0.5, 0.2, 0.1 atomic percent).

In this regard it is to be noted that the thickness or depth 18 of the amorphous layer 14 is essentially based on the mean average distance or mean range of the dopant from the sensor surface, which can be determined/measured (see, e.g., Rutherford Backscattering or "RBS") or alternatively calculated/simulated (see, e.g., a standard monti carlo simulation called TRIM; J. F. Ziegler et al., *The Stopping and*

*Range of Ions in Solids*, Pregamon, Oxford (1985)) by means common in the art. As further described herein, when formation of this amorphous layer is achieved by implantation (e.g., ion implantation), the mean range or mean average distance is at least in part a function of the mass of the implantation species, the implantation energy and the density of the polymer layer to be implanted.

Figure 5:
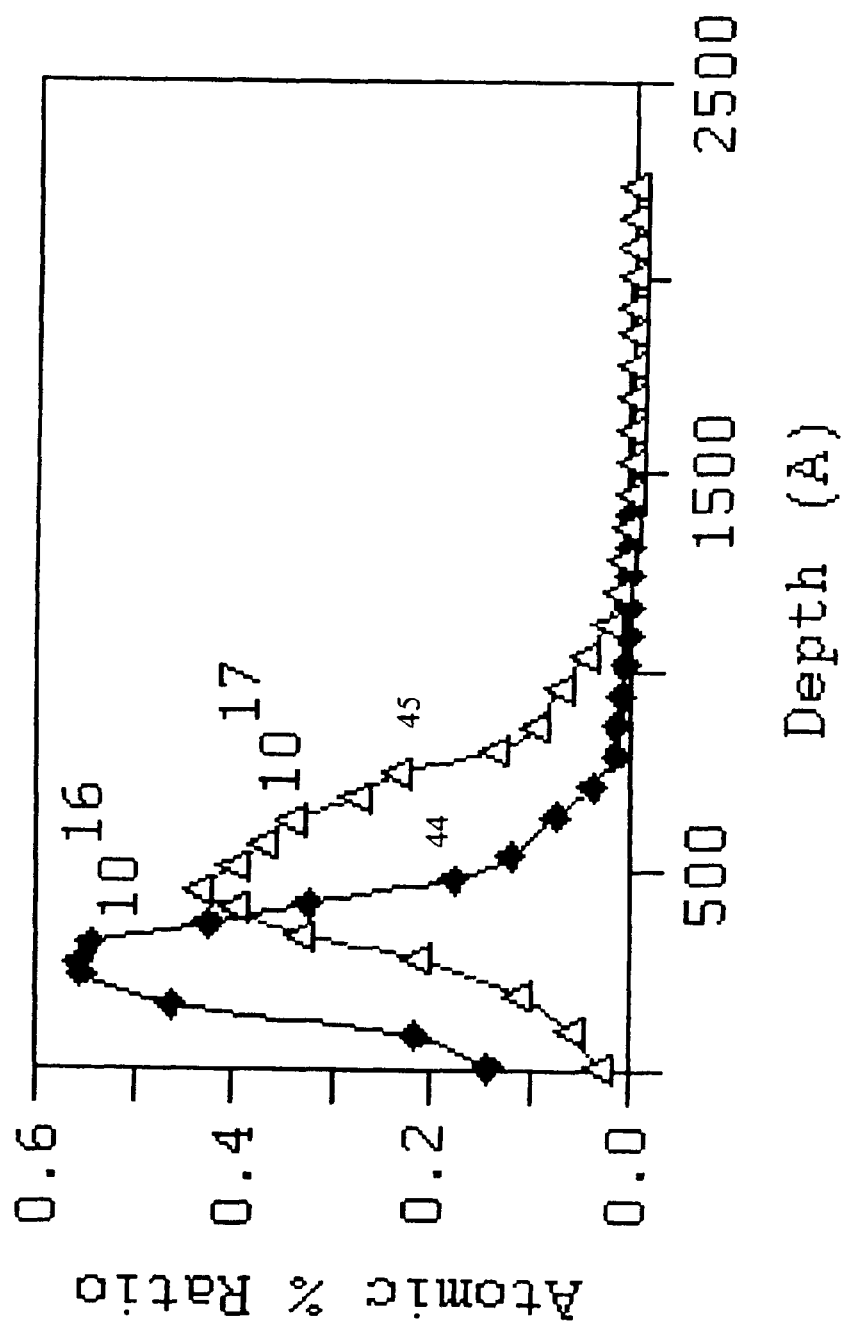
FIG. 5 generally illustrates how the concentration distribution and maximum concentration of a dopant (e.g., a metal) in the organic carbon-containing sensor changes as the implantation energy changes, in accordance with one embodiment of the present invention.

Furthermore, depending upon the manner by which the amorphous layer 14 is formed, there can be a distribution of dopant migration or penetration depths or distances throughout the layer (see, e.g., FIG. 5 for an example of implantation distribution, which is further described herein). For example, depending upon the conditions employed for an implantation process, about 75%, 85%, 90% or more of the dopant may be present within the amorphous layer over a depth or thickness extending from about 50 angstroms from the surface of the sensor to about 750 angstroms, from about 75 angstroms to about 500 angstroms, or from about 100 to about 250 angstroms.

The concentration of the dopant in the amorphous layer 14 will vary, depending upon for example the desired application or the particular component to be used. Typically, however, in one embodiment, this concentration ranges from about 10 to about 90 atomic percent, from about 20 to about 80 atomic percent, from about 40 to abut 70 atomic percent, or from about 50 to about 60 atomic percent. In a second embodiment, this dopant concentration may alternatively be expressed in terms of atoms/cm$^3$, the dopant concentration typically being at least about $1 \times 10^{20}$ atoms/cm$^3$, $5 \times 10^{20}$ atoms/cm$^3$, $1 \times 10^{21}$ atoms/cm$^3$, $5 \times 10^{21}$ atoms/cm$^3$, $1 \times 10^{22}$ atoms/cm$^3$ or more.

The dopant concentration, as well as the concentration distribution and depth or thickness of the layer comprising it (i.e., the amorphous layer), are most preferably controlled in order to optimize the overall performance of the sensor and/or the device. For example, with respect to the concentration, in at least some embodiments the concentration is most preferably controlled to be at or near the conduction percolation threshold of the sensor, and preferably at or near this threshold at room temperature; that is, the concentration is preferably optimized such that the conductivity of the sensor is at or near the point at which the behavior or characteristics "cross over" from semiconductive to metallic. This is advantageous because, when at or near this transition, very small changes in temperature, such as that caused by exposure to infrared radiation, result in large changes in resistivity. In view of the fact that this transition can be controlled by means of controlling this concentration, the transition can be spread over a large temperature range, which means the need for a temperature control device can be eliminated. As a result, the sensor is well suited for used in passive, uncooled IR sensors, such as bolometers.

When formation of the amorphous layer 14 is achieved by an implantation process (as further described herein), this layer may additionally comprise an implanted species, which in some instances may be the same or different from the dopant. Additionally, when present, the second layer 20 may also comprise the implanted species (in those instances wherein the implantation species differs from the dopant). When the second layer 20 is present, the amorphous layer 14 and the second layer 20 may have a combined thickness (i.e., 18 plus 22) which is about equal to the thickness 16 of sensor 12.

Figure 2A:
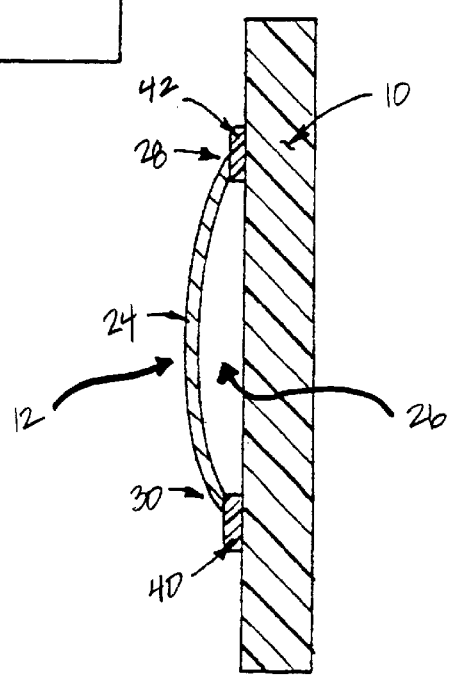

Referring now to FIGS. 2A and 2B, preferably at least a portion or segment comprising the amorphous layer of the sensor 12 is thermally isolated from the underlying substrate. While this may be achieved by means common in the art (e.g., by means of an insulating layer or film of some kind, disposed between the sensor and the substrate), preferably thermal isolation is achieved by means of spacing this portion from and above the substrate 10, forming a bridge-like structure 24. This "bridge" is thermally isolated from a region 26 of the substrate beneath the bridge, commonly referred to as the "absorption cavity," while opposing first 28 and second 30 ends of the sensor 12 remain in contact with the substrate, and more specifically electrical contact with the substrate. This contact between the sensor and the substrate can be achieved by means common in the art; for example, in one embodiment the sensor is in contact with the substrate by electrically conductive pathways, and more specifically by a current supply pathway 40 and a current receiving pathway 42. These conductive pathways can be formed of materials common in the art, including for example a metal (e.g., gold, nickel, copper, titanium, tungsten or a mixture or alloy thereof), a thermocouple material (e.g., iron-gold or copper-constantan), a highly conductive polymer (e.g., a polyaniline), or a highly doped semiconductor. As further described herein, this "bridge" structure can be formed by means common in the art, including common microlithographic techniques wherein for example a portion of the substrate 10 (or a portion of some other material, such as an insulating layer, present between the sensor 12 and the substrate, or a portion of the sensor itself) is etched or removed.

Regardless of the manner by which the bridge is formed, it is to be noted that the distance between the bottom of the sensor, at about the apex of the bridge, and the substrate essentially directly beneath this apex, can be controlled in order to optimize or "tune" the sensitivity of the device for a given infrared wavelength. Stated another way, the depth of this absorption cavity can be optimized for short wavelength IR detection (e.g., about 1 to 3 $\mu$m), medium wavelength IR detection (e.g., about 3 to 5 $\mu$m), or long wavelength IR detection (e.g., about 8 to 14 $\mu$m), with greater depths being employed for longer wavelengths and vice versa. Typically, however, the structure is designed to form a one-quarter wavelength cavity that resonates with the incoming infrared radiation; that is, typically the structure is designed such that the depth is about one-quarter of the wavelength to be detected. For example, for long wavelength detection, this depth or distance ranges from greater than about 1 to less than about 4 microns, and preferably from about 2 to 3 microns, with about 2.5 microns being most preferred.

Generally speaking, the amorphous layer 14 of the sensor 12, and optionally the entire sensor, is comprised of organic carbon and the dopant; that is, the layer is derived from a material which has carbon as its primary component (e.g., at least about 50 wt. %, 60 wt. %, 70 wt. %, 80 wt. %, 90 wt. % or more). In some embodiments, the organic carbon component of this layer may be characterized as a "depleted" (e.g., hydrogen- or halogen-depleted) organic polymer, depletion occurring as a result of the breaking of carbon-hydrogen or carbon-halogen bonds during formation of the amorphous layer of the sensor (as further described herein). Accordingly, because the sensor possesses "polymer-like" character, in that a substantial portion (if not all) of the polymer backbone remains intact after the doping process, the sensor of the present invention possesses significantly improved strength and flexibility (as further described herein) compared to metal or carbon-metal alloys commonly employed in IR detectors.

It is to be noted that, as used herein, "depleted polymer" generally refers to an organic polymer which has been subjected to a process which, as previously noted, has caused the breaking of bonds between carbon atoms in the polymer chain backbone and, for example, hydrogen, halogen or small alkylene (e.g., methylene, ethylene, etc.) substituents. The resulting organic material is therefore "polymer-like," in that the polymer backbone remains essentially intact, while a substantial portion of hydrogen, halogen or small alkylene substituents are lost. For example, in some instances at least about 50%, 75%, 85%, 90%, 95% or more (e.g., 97% , 99% , etc.) of the hydrogen or halogen atoms present are eliminated; that is, in some instances the hydrogen or halogen content of the initial polymer layer, from which the sensor is derived, is reduced by 50%, 75%, 85%, 90%, 95% or more. Stated another way, after the process is complete, a "depleted" layer of the sensor may have a hydrogen content, or alternatively a halogen content, of less than about 50 atomic percent, 25 atomic percent, 15 atomic percent, 10 atomic percent, or even 5 atomic percent (e.g., 3 atomic percent, 1 atomic percent, etc.).

The sensor 12 can essentially be derived from any organic polymer common in the art which is capable of forming a free-standing film or "bridge" and which is compatible with the other components of interest in the amorphous layer 14; that is, essentially any organic polymer which can be used to form a compositional or alloy layer 14 having the desired concentration of the dopant of interest and still form a free-standing film may be used.

Preferably, however, the sensor is derived from an organic polymer or polymers which are conducive to film formation by means common in the art (e.g., spin coating, spray coating, brushing, roller coating, casting, meniscus coating or dipping). As a result, the sensor is preferably derived from a polymer or polymers capable of being dissolved in an aqueous or non-aqueous solvent, such that a substantially uniform and continuous layer can be formed on the substrate upon solvent removal. Exemplary polymers, from which the sensor may be derived, include for example substituted or unsubstituted: styrenes or other vinyl polymers (e.g., halogenated vinyl polymer like polyethylene, including poly (tetrafluoroethylene) or "PTFE"), polyethers (e.g., poly (etheretherketone) or "PEEK"), polyamides, polyimides and their precursors, polyesters, polyurethanes, polysulfones, polybenzocyclobutanes, phenol-formaldehyde resins, acrylic polymers (having, for example, pendant nitrile, styrene or ester groups), or soluble versions of 15 polyanilines, or other intrinsically conductive polymers or biopolymers (see, e.g., U.S. Pat. No. 6,160,257, incorporated herein by reference). In one embodiment, preferred polymers for implantation include copolymers of styrene with nitrile-containing acrylic polymers (e.g., polyacrylonitrile or polymethacrylonitrile), or halogenated polymers (e.g., PTFE). Alternatively, oxygen-containing polymers are also preferred (e.g., polyethers, including PEEK, polyesters, etc.) because, without being held to a particular theory, these are believed to form favorable oxide complexes with metals.

It is to be noted that, as used herein, "polymer" includes homopolymers and copolymers (e.g., diblock, triblock, graft, etc.), as well as oligomers, thermosetting polymer precursors, or other organic compounds, as well as blends thereof, which can form a continuous, high-quality film. It is to be further noted that the polymer(s) from which the sensor is derived may be linear or branched, and optionally may be crosslinked. However, as further described herein, depending upon the manner by which the sensor is formed, the density or physical character of the polymer from which the sensor is derived may limit, for example, (i) the maximum dopant concentration, (ii) the time needed to attain the desired dopant concentration, and/or (iii) the depth or thickness of the amorphous layer 14 containing the dopant. Additionally, highly branched or crosslinked polymers may in some instances detrimentally impact physical properties of the resulting sensor (e.g., rigidity, flexibility, strength, etc.), such as when the sensor comprises an underlying or second layer 20, or additionally a third layer, that is essentially unaffected or unaltered by the process for preparing the amorphous layer 14.

In one embodiment, essentially any species that will alter conductivity or resistivity of the sensor can be employed. Accordingly, one or more species selected from the following can be employed: (i) a transition metal (e.g., silver, gold, copper, chromium), (ii) an actinide metal, (iii) an alkali metal (e.g., lithium), (iv) an alkaline earth metal (e.g., magnesium, strontium), (vi) a main group metal (e.g., lead, tin, indium, cadmium, bismuth, antimony, zinc, thallium, germanium, gallium, aluminum), (vii) a metal-like, non-metal (e.g., tellurium, arsenic, silicon, boron, phosphorous), or (viii) mixtures thereof. However, in one preferred embodiment, the dopant is aluminum, an element having an atomic number greater than 18, or a mixture thereof, while in another the dopant is p-type, ntype, a metal or a mixture thereof. Particularly preferred dopants, for one or more embodiments include copper, chromium silver, tellurium and mixtures thereof. Particularly preferred combinations, for at least some applications, include sensor having an amorphous layer containing organic carbon derived from PTFE, PEEK or PSA and copper, tellurium or chromium, respectively.

In this regard it is to be noted that the term "metal-like nonmetal" generally refers to a dopant which has metal-like properties or characteristics, but which is not a "metal" on the periodic table; that is, this term generally refers to a dopant which is not a metal but which has an effect on the present sensor film which is similar to a metal.

It is to be further noted that, when a metal is to be employed, in some embodiments it is preferable for the metal to be insensitive to a magnetic field (e.g., copper, aluminum, silver, etc.), while in other embodiments it is preferable for the metal to be sensitive to such a field (e.g., iron or nickel).

It to be still further noted that, in alternative embodiments, an insulator, such as silicon dioxide, silicon nitride, or aluminum oxide, is employed; that is, in alternative embodiments the amorphous layer of the sensor comprises an insulator as the dopant.

Essentially any substrate which can support the sensor of the present invention and which has an appropriately low thermal conductivity can be used. In a first embodiment, however, typically a non-conductive material is employed, such as that selected from, for example: (i) inorganic insulators (e.g., glass, quartz, aluminum oxide, silicon dioxide, silicon nitride), or (ii) a variety of polymers (e.g., polyimides, polyesters, halogenated polymers, such as PTFE, or other types of free-standing polymer films). Alternatively, however, a conductive material, such as a metal (e.g., copper, aluminum, etc.) or a semiconductor (e.g., silicon, such as single crystal silicon), upon which an insulating layer (e.g., silicon dioxide or silicon nitride) is first deposited, is used. Silicon having a silicon oxide surface layer is preferred for some embodiments, due to its common application in integrated circuit manufacturing processes.

It is to be noted that when flexible substrates, such as certain insulating polymer films, are employed, these "substrate films" can be attached to an inflexible support in order to maintain rigidity during the coating (e.g., spin coating) process.

It is to be further noted that one advantageous feature of the present invention, over other devices designed for long wavelength detection, is that arrays of sensors or detectors can be monolithically synthesized on silicon multiplexer substrates for array readouts (as further described herein). This is because organic polymers, from which the present sensor may be derived, adhere to most substrate materials. In contrast, most existing technologies are "hybrid" structures which require unique substrates.

Finally, it is to be noted that the above description is intended for illustration only. Accordingly, other device or detector arrangements or configurations may employ the present sensor without departing from the scope of the present invention. For example, in some instances, a second, third, etc. layer may be present between the sensor and the substrate, which may be also be an "alloy" as described herein (with the same or different components), implanted, or both. Alternatively, this second, third, etc. layer may be substantially free of a dopant or an implantation species. One or more devices or device layers (e.g., readout or processing circuitry of some kind, as well as electrical contacts) may also be (i) present between a portion of the sensor and the substrate (that is, the sensor may be formed on top of circuitry which makes up the infrared detection system or device), or (ii) fabricated or formed on top of the sensor.

Additionally, an infrared absorbing material, such as a polymer or an inorganic material commonly employed in the art, may be applied to the absorption cavity surface as part of the device preparation process. However, it is to be noted that, in the present invention, the use of such a material is not narrowly critical to performance or sensitivity of the present device. More specifically, conventional infrared detection devices commonly employ such absorption coatings. As a result, additional processing steps, and thus added cost, is involved in their production. The present invention is therefore advantageous in that such coatings are not required. However, such coatings may be employed without departing from the scope of the present invention.

Preparation

Generally speaking, in accordance with the present invention, it has been discovered that an infrared imaging system having improved performance characteristics can be prepared by means of employing a sensor having a segment which is thermally isolated from the substrate, and which is conductive as a result of comprising an amorphous layer containing organic carbon and a high concentration of a dopant. Although essentially any method by which a dopant can be diffused or introduced into an organic material, such as an organic polymer, to the desired concentration, can be employed, the present invention preferably employs an implantation process in order to form an "ion beam mixed" layer (i.e., the amorphous layer), as described herein.

Figure 3:
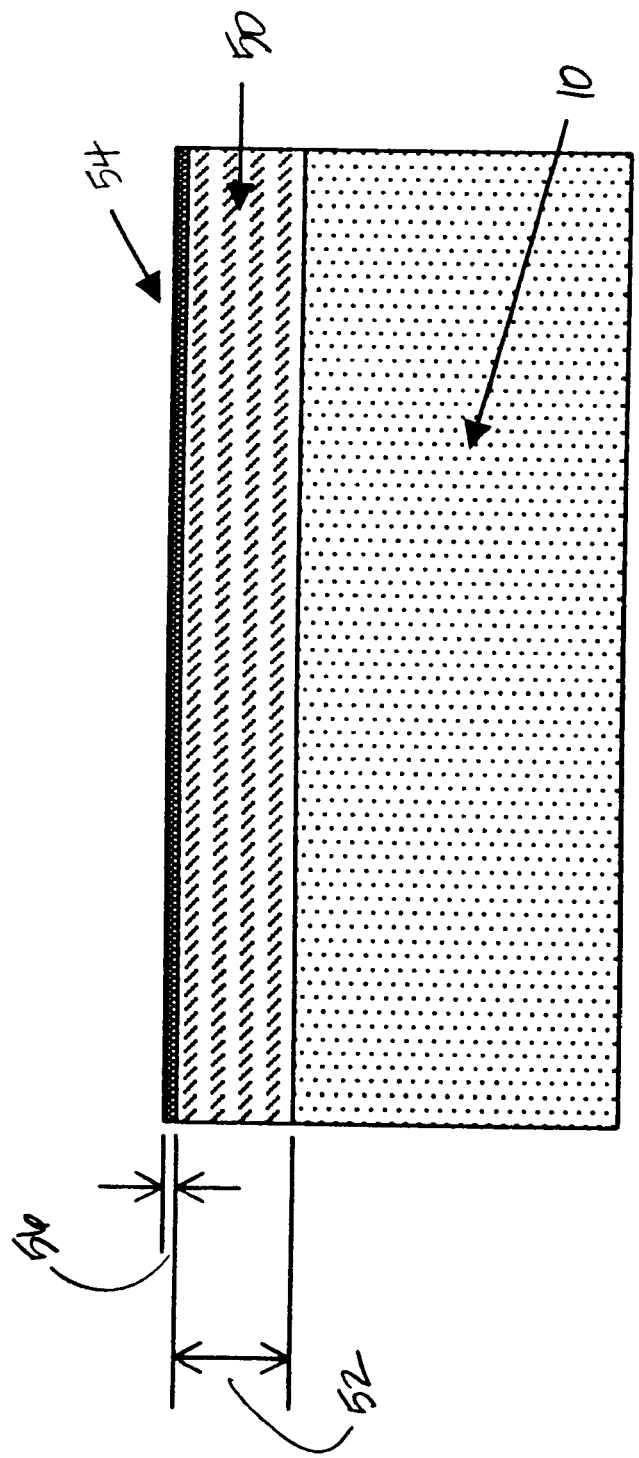
FIG. 3 is a schematic, cross-sectional view generally depicting different layers applied to a substrate, prior to device formation, in accordance with one embodiment of the present process.
Figure 4:
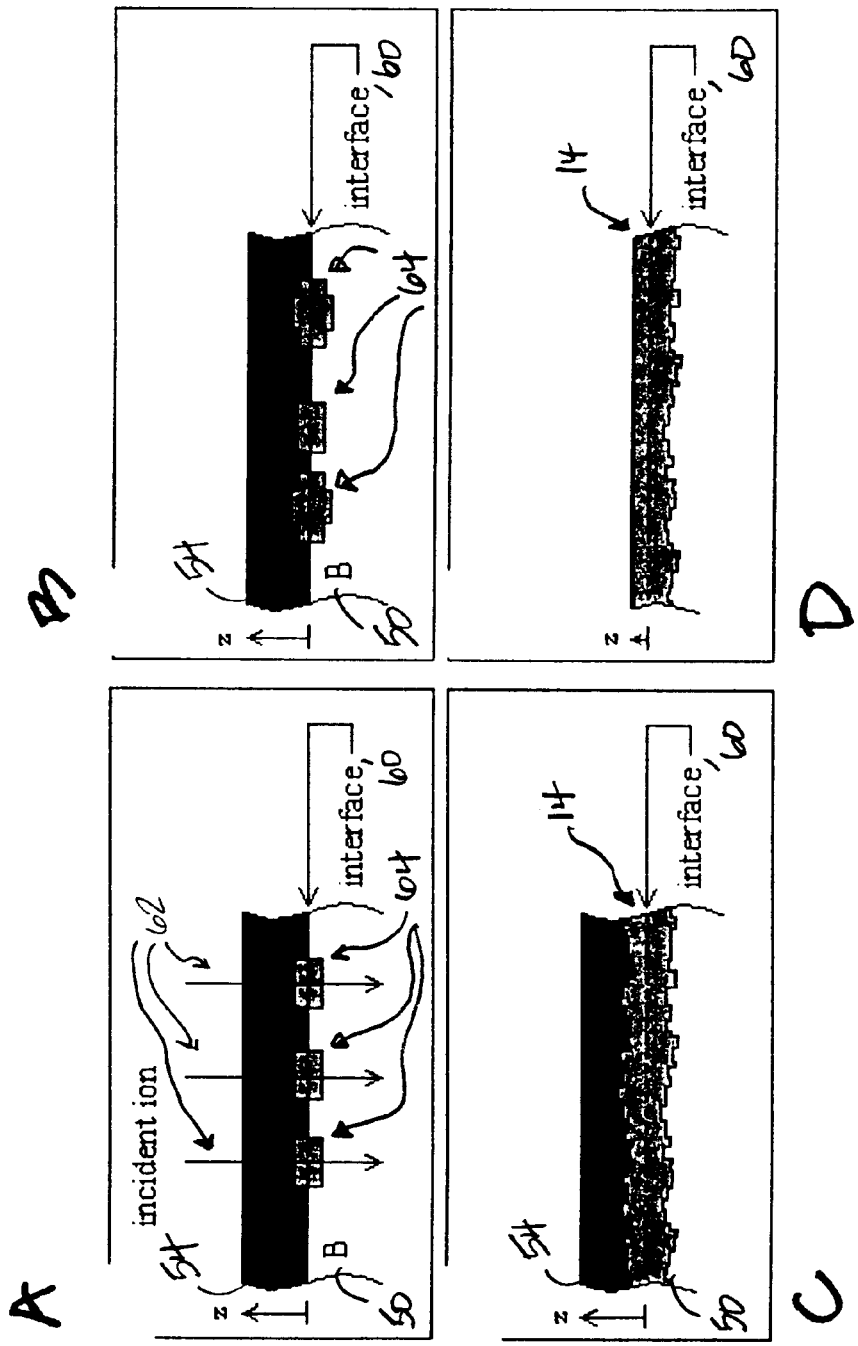
FIGS. 4A through 4D are schematic, cross-sectional views generally depicting various stages through which the organic (e.g., polymer) layer passes during the implantation or "ion beam mixing" process of the present invention.

Referring now to FIG. 3, in one embodiment an organic material (e.g., an organic polymer) layer 50 is formed on a substrate 10 surface (or upon an insulating layer, device layer, or some other processing circuitry present thereon, which is not shown here). Essentially any method for forming, for example, a polymer layer on a substrate, or alternatively depositing or coating a substrate surface with a polymer layer, can be employed (such as spin coating, roller coating or meniscus coating). Typically, however, in a first embodiment the polymer is applied to the substrate in the form of an aqueous or non-aqueous solution. The concentration of the polymer in solution will vary, at least in part dependent upon the solubility of the polymer in the solvent to be employed, the molecular weight of the polymer and the desired thickness of the resulting polymer layer. Typically, however, concentrations range from at least about 1 weight percent to less than about 90 weight percent, from at least about 5 weight percent to less than about 80 weight percent, from at least about 10 weight percent to less than about 70 weight percent, or from at lest about 15 weight percent to less than about 60 weight percent. If the resulting layer is to be subjected to subsequent microlithographic patterning, preferably this polymer solution is filtered prior to coating of the substrate surface in order to remove small particles which might be present. The extent of the filtration is at least in part dependent upon the smallest feature size to be patterned. Typically, however, filtration is performed to remove particles down to about 1 micron in size (e.g., less than about 0.8, 0.6, 0.4, or even 0.2 microns).

As noted, a number of means common in the art may be employed to deposit or apply the polymer solution onto the substrate 10. In a preferred embodiment, however, spin coating is utilized. The resulting thickness 52 of layer 50 is at least in part a function of the conditions employed in applying the polymer solution (e.g., spin or rotation speed for spin coating), as well as the concentration of the solution and the amount of the solution applied to the substrate. Typically, however, such conditions will be controlled in order to optimize the performance of the resulting sensor. More specifically, the various parameters involved in coating the substrate and forming the polymer layer will be controlled in order to achieve a resulting sensor which possesses the desired properties. Generally speaking, however, in a first embodiment the deposited polymer layer 50 will have a thickness 52 which is about equal to the mean average distance or mean range of the implantation species and/or the dopant under the process conditions employed, such that essentially the entire sensor is comprised of the amorphous layer 14 (see, e.g., FIG. 1) once the process is complete. Stated another way, in a first embodiment the polymer layer thickness will be such that, after the present process is complete, essentially the entire sensor from top (e.g., the point furthest from the substrate) to bottom (e.g., the point closest to the substrate) comprises the dopant. Typically, this initial polymer layer thickness will range from at least about 200 angstroms to less than about 2000 angstroms, from at least about 300 angstroms to less than about 1750 angstroms, from at least about 400 angstroms to less than about 1500 angstroms, or from at least about 500 angstroms to less than about 1250 angstroms.

It is to be noted, however, that in an alternative embodiment only a portion of the resulting sensor comprises the amorphous layer 14, which means the initial polymer layer thickness exceeds the mean average distance the implantation species and/or the dopant will penetrate the polymer layer; that is, in some embodiments the polymer layer thickness may be 2, 3, 4 times or more this mean average distance. Typically, however, in this embodiment the initial polymer layer thickness ranges from about 1000 to about 4000 angstroms or more (e.g., from about 1250 to about 3500 angstroms, from about 1500 to about 3000, or from about 2000 to about 2500 angstroms).

Additionally, it is to be noted that, when implantation is employed and the implantation species differs from the dopant, the initial polymer layer thickness may be adjusted to ensure that a fraction of the polymer layer, or the entire layer, is implanted, a portion or all of the implanted layer also comprising the dopant; that is, when ion implantation is to be employed to form the amorphous layer 14 of the sensor, the initial polymer layer thickness may be adjusted to ensure a fraction or all of the resulting sensor is "ion implanted."

After application of the polymer solution is complete, solvent is removed to form the polymer layer. Generally speaking, essentially any solvent removal techniques common in the art may be employed. Typically, however, solvent evaporation is achieved by heating or baking, at ambient pressure, at a temperature greater than about 90° C. Once the polymer layer has been formed, a "target" layer 54 comprising the dopant (see FIG. 3) is deposited thereon. Formation of this layer may be achieved by means common in the art. Typically, however, the dopant is applied to the surface by sputtering, reactive evaporation, ion-assisted evaporation or thermal evaporation, with vacuum evaporation or sputtering being most commonly used.

Like the thickness of the polymer layer 50, the thickness 56 of the target layer 54 is at least in part a function of the implantation energy to be employed and/or the penetration depth of the implantation species, the desired thickness of the amorphous layer 14 to be obtained, and the resulting concentration of the dopant therein. Accordingly, the relationship of each of these parameters is to be considered, particularly in view of the discussion provided herein. Generally speaking, however, the target layer 54 has a thickness 56 which is less than about 30% of the penetration depth of the implantation species, and in some instances is less than about 25%, 20%or even 15%.

Typically, therefore, the target layer 54 has a thickness 56 which ranges from about a few tens of angstroms (e.g., about 25 20, 30, 40, 50, 80 or more), to a few hundred angstroms (e.g., about 100, 200, 400, 500, 700 or more) or more (e.g., about 1000, 1250, 1500 angstroms or more), as determined by means standard in the art (e.g., scanning electron microscopy or deposition monitors). In a preferred embodiment, however, this layer thickness ranges from about 50 to about 750 angstroms, from about 100 to about 500 angstroms, or from about 125 to about 250 angstroms.

In this regard it is to be noted that if the target layer 54 comprising the dopant is too thin (e.g., less than about 10% or even 5% of the penetration depth), it can be sputtered off of the polymer layer surface during the implantation process. Additionally, if this layer is too thick, such that it exceeds the penetration distance of the implantation species, the dopant may not be driven into the polymer layer. For example, in some instances, if this layer exceeds about 700 angstroms and the ion energy is about 50 keV, nitrogen implantation ions will not penetrate through this layer.

Following application of the target layer 54, in a preferred embodiment ion implantation is performed. Ion implantation can be achieved by means common in the art (see, e.g., U.S. Pat. Nos. 5,629,665 and 5,753,523, incorporated herein by reference), using a common implantation instruments (such as those used for silicon-based semiconductors) in order to generate an "ion beam mixed" (or "IM") layer (i.e., the amorphous layer 14) extending from the surface of the sensor downward toward the substrate; that is, once the target layer 54 has been applied, the surface of this layer is impacted with a beam of ions, for example, which results in the diffusion or migration of the dopant into the polymer layer.

Referring now to FIGS. 4A–4D, without being held to any particular theory, it is generally believed that the collisions which occur between the implantation species (e.g., ions) and the target layer act to drive or force the dopant contained in the latter into the polymer layer. As a result, an interface 60 between the target layer 54 and the polymer layer 50 near the impinging ion track 62 becomes mixed and forms regions of disorder 64. As the process continues and more ions strike and penetrate the target layer 54, the localized regions of disorder 64 expand and eventually overlap, forming the amorphous layer 14 of the sensor. In addition to diffusing the dopant into the polymer layer, the implantation process also results in the evolution of hydrogen ($H_2$) gas, as well as small hydrocarbons (e.g., $CH_3$, $CH_4$, etc.), or even halogens (e.g., fluorine, chlorine, bromine, etc.) when present, which are displaced by the impinging ions and/or the diffusing dopant. This evolution can be monitored during the process by means common in the art (e.g., residual gas analyzer or "RGA"). Once the process is complete, the degree of depletion can also be determined by direct analysis of the sensor, such as by nuclear reaction analysis("NRA").

It is to be noted that, as a result of this depletion of a portion or all of the polymer layer, the degree of depletion depending upon the penetration depth of the implanting species and/or dopant, densification occurs; that is, as a result of the loss of hydrogen, halogens or other hydrocarbon molecules, the distance or spacing between polymer chains decreases. The final thickness 16 of the resulting "polymer-derived" sensor 12, relative to the initial thickness 56 of the polymer layer 54, therefore also decreases (e.g., a decrease in the original polymer film thickness by about 10%, 20%, 40%, 60% or more). In addition, due to the manner by which the dopant diffuses through the polymer film during the implantation process, typically the resulting amorphous layer 14 of the sensor 12 will be thicker than the target layer 54 initially deposited on the polymer layer.

It is to be further noted that, as described in detail above, "depleted" refers to an organic polymer which has been subjected to a process which results in the substantial loss of hydrogen, halogens and/or other small alkylene molecules, while the polymer backbone remains essentially intact. Accordingly, when the entire polymer layer is not depleted, the resulting sensor of the present invention may comprise different layers having distinctly different compositions and behaviors; that is, the resulting sensor may comprise an amorphous or depleted polymer layer 14 containing organic carbon and a dopant, an underlying second layer 20 which is also depleted (but which is substantially-free of the dopant) and optionally a third layer (not shown) which is substantially not depleted (i.e., substantially-free of both the implantation species and the dopant). Such layers of the sensor may therefore differ not only in terms of component concentration and resistivity, but also hardness and/or flexibility (due to the fact that the third layer may essentially remain as an intact or unaltered portion of the initial polymer layer).

Referring again to FIGS. 4A–4D, without being held to any particular theory, it is generally believed that one advantageous feature of the implantation or "ion beam mixing" process of the present invention is that an irregular interface is formed between the amorphous layer 14 of the sensor and, to the extent present: (i) an underlying implanted layer 20, which is substantially-free of the dopant, (ii) the substrate 10 (when, for example, the thickness of amorphous layer 14 is essentially equal to the sensor), or (iii) a layer interposed between the amorphous layer and the substrate. This irregular interface is believed to be due to the varying depths to which the dopant and/or implanted species diffuse or penetrate the polymer layer. This lack of a sharp interface is believed to result in a significantly stronger adhesion between the various regions of the sensor and/or the sensor and substrate.

Yet another advantageous feature of the present invention is that, by employing an organic polymer-derived sensor, a much stronger and more flexible sensor is obtained, one that is capable of forming a self-supporting, bridge-like structure. As a result, a supporting structure of some kind is not needed in order to form a bridge, which means the detector of the present invention can be more easily and economically fabricated (using photolithographic techniques, for example, which are common in the art).

The implantation process may be carried out using techniques, equipment (such as ion implanters commercially available from Varian) and process conditions common in the art. Accordingly, the implantation species (e.g., ions, atoms, molecules, etc.), the dose of the implantation species, the energy of implantation, duration of the implantation process, as well as other process conditions (e.g., implant temperature, beam current, etc.) can be selected from that which is common in the art. However, generally speaking, at a minimum, conditions will be employed which enable the implantation species to penetrate through the target layer and into the underlying polymer layer; that is, the conditions are generally such that the mean range of the implantation species exceeds the thickness of the target layer comprising the dopant. The implantation species (which in some instances may have a net neutral, positive or negative charge), is typically selected from nitrogen, boron, carbon, oxygen, carbon dioxide, arsenic, or boron trifluoride ($BF_3^+$), with nitrogen or nitrogen ions being preferred for some applications. However, it is to be noted that, in some instances, the dopant of the amorphous layer and the implantation species can be the same.

While the dose or fluence can vary depending upon a number of factors, as indicated above, typically values of at least about $1 \times 10^{14}$ ions/cm$^2$ are employed, with values of at least about $1 \times 10^{15}$, $1 \times 10^{16}$, about $1 \times 10^{17}$ ions/cm$^2$ or more being preferred for some embodiments. As can be seen in FIG. 5, as the dose increases from about $1 \times 10^{16}$ to about $1 \times 10^{17}$, for some applications (e.g., copper/PTFE-derived sensor) the concentration distribution of the dopant broadens, the distribution extending over a distance of about 750 angstroms from the surface at $1 \times 10^{16}$ and over about 1000 angstroms from the surface at $1 \times 10^{17}$, with maximum concentrations shifting from about 300 to about 500 angstroms, respectively. Therefore, it can be seen that the dopant concentration or concentration distribution is in part dependent upon the dose of the incident species.

Other process conditions, such as beam current density and ion energy can also vary. While it is preferably to keep beam current density low (e.g., ranging from about 0.1 to about 1 microamp/cm$^2$ or from about 0.2 to about 0.8 microamp/cm$^2$), beam current density can range from about 0.1 microamps/cm$^2$ to about 10 microamps/cm$^2$ (e.g., from about 0.5 to about 8, from about 1 to about 6, or from about 2 to about 4 microamps/cm$^2$) or more. Ion energy may range from about 20 KeV to about 20 MeV (e.g., about 25 KeV to about 1000 KeV, from about 50 KeV to about 750 KeV, from about 75 to about 500 KeV, or from about 100 to about 250 KeV), with values of 25, 35, 50, 75, 100, 150, 200 or even 250 being preferred for some applications.

In this regard it is to be noted, however, that experience to-date suggests ion beam energy is a second order effect, at least until about the MeV range is reached.

For some applications, the ambient stability of the resulting depleted layer of the sensor, such as a depleted poly(styrene-co-acrylonitrile)-derived ("PSA") or a poly(styrene-co-methacrylonitrile)-derived layer for example, can be improved through a post-implantation anneal, wherein the resulting device is heated at an elevated temperature for a period of time. For example, such a device may be heated to a temperature ranging from about 75° C. to about 400° C., or from about 100° C. to about 200° C. for several minutes (e.g., 30, 60, 90, 120 minutes or more) up to about several hours (e.g., 5, 10, 25, 50, 75, 100 or more).

After the implantation process is complete, typically most or essentially all of the target dopant layer is either diffused into the polymer layer or sputtered off the polymer layer surface. Any dopant which remains may be removed by means common in the art. For example, because the dopant is below the surface of the sensor (e.g., typically about 25 angstroms, 50 angstroms or more), the surface can be cleaned with a solvent (e.g., an acetone solution) without disturbing the amorphous layer of the sensor.

It is to be noted that the detector of the present invention, and more particularly the sensor, can be prepared by other means common in the art. For example, in an alternative embodiment, the dopant may be implanted directly into the polymer film; that is, the implantation species can be the dopant. Alternatively, a plasma (e.g., metal plasma) may be used to directly implant the dopant. However, one advantage of the present "ion beam mixing" process is that substantially higher dopant concentrations can typically be achieved using comparatively lower ion beam energies. Stated another way, using the present combination of implantation and a target dopant layer, dopant concentrations can typically be achieved which are significantly higher (e.g., 2, 3, 4 orders of magnitude or more) than implantation only processes.

It is also to be noted that other techniques common in the art may be employed to refine or enhance the performance of the device, for a given application. For example, the sensor of the present invention may additionally comprise an infrared absorbing dye or pigment, or alternatively the detector may additionally comprise an infrared-absorbing coating on the sensor.

Accordingly, it is to be understood that the present invention may be prepared or modified by means other than herein described without departing from the scope provided herein.

Array

The IR detector of the present invention may advantageously be formed into any array by subjecting it to patterning techniques common in the art, such as photolithography or microlithography techniques. Such an array may be formed on a single substrate as part of a larger device or as a series of devices. Such arrays are particularly well-suited, for example, for use in staring mode, room temperature, long wavelength IR applications.

Figure 6:
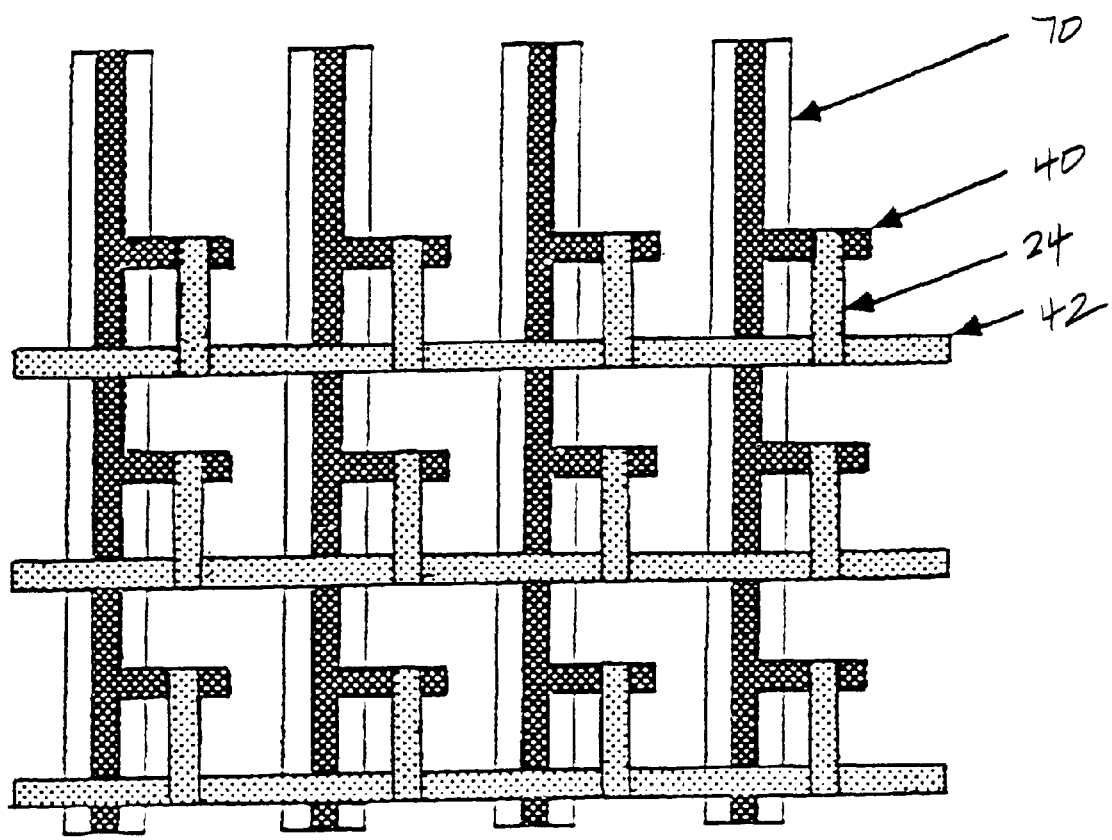
FIG. 6 is a top plan view of a multi-element resistor array, formed by lithographic patterning, of sensors of the present invention.

Referring now to FIG. 6, the manufacture of a multi-element resistor array generally involves process steps common in the semiconductor industry. For example, electrical interconnects (e.g., gold current supply 40 and return 42 pathways or means, which are electrically isolated from each other) may be deposited on a silicon substrate (e.g., wafer) surface (not shown), upon which an insulating layer 70 (e.g., silicon oxide or silicon nitride) has been formed, by means common in the art (see, e.g., U.S. Pat. No. 5,753,523, incorporated herein by reference), such as by vapor deposition or vacuum evaporation. The interconnects or pathways may then be patterned by photolithography. A polymer layer is then deposited, by spin coating for example, and solvent is evaporated to form a polymer film. After application of a desired target dopant layer is complete, the amorphous layer of the sensor is formed by means of ion implantation. The resulting sensor is then patterned by the coating the film with a photoresist and imaging the resist to form an etch mask. The sensor is then removed from areas not covered or protected by the photoresist mask by reactive ion etching. The photoresist may then be removed by an appropriate solvent.

The sensor may be "thermally isolated" by formation of the sensor bridge, the bridge being released from the substrate by means of, for example, etching a portion of the substrate (or some other layer or layers, such as the insulating layer, or alternatively a portion of the polymer layer which was not doped and/or implanted by the present process) beneath a segment of the sensor comprising the amorphous layer, forming an absorption cavity. Thermal isolation is desirable because it acts to reduce heat loss of the sensor to the substrate and/or underlying layers, thus increasing sensitivity and decreasing the time constant of the sensor. Dissolution may be achieved by use of hydrofluoric acid, for example, which generally does not affect the electrical behavior of the sensor. However, it is to be noted that exposure to the acid for an excessive amount of time may affect the "clusters" (e.g., metal clusters) within the amorphous layer of the sensor as a result of diffusion. Additionally, prolonged exposure to the acid can result in an undesirable degree of undercutting of the electrical interconnects or pathways. Accordingly, exposure time is preferably limited to only that which is needed to successfully form the bridge structure.

It is to be noted that this and other techniques common in the art may be employed to "tailor" pixel or sensor size, and cavity size or depth for a desired application or the IR wavelength range to be detected. Furthermore, other configurations using such techniques can be achieved (e.g., electrical contacts formed on top and along the edges of the sensor film).

Additionally, it is to be noted that these arrays, as well as the size of each sensor in the array, can vary. Generally speaking, the maximum size of a sensor, or "pixel," is determined by the strength of the carbon-based bridge itself. Experience to-date suggests bridge lengths of at least about 25 microns, 50 microns or even 75 microns can be obtained. Typically, however, the size of each pixel or sensor in the array has a dimension ranging from about 5×5 microns to about 50×50 microns, from about 10×10 microns to about 40×40 microns, or from about 20×20 to about 30×30 microns, with 25×25 being most commonly employed. Additionally, the size of the array can also vary, with array sizes of about 480×640 pixels or 576×768 pixels being common, with sizes of up to about 1200×1600 pixels being desirable for some applications. When such arrays are prepared, the present invention has the added advantage of enabling the preparation of a detector having improved uniformity and fill factor, as further described herein.

It is to be still further noted that arrays employing the sensor of the present invention can be prepared by other means common in the art, and/or may additionally comprise other steps. For example, a monolithic infrared detector array may be prepared by depositing the polymer layer on readout or multiplexer CMOS circuits (connected internally with metal or semiconductor vias), the current supply and receiving pathways, etc., and then conducting the present ion beam mixing process. Accordingly, the description provided herein is intended to be illustrative only. It is therefore to be understood that the present invention may be patterned into an array by means other than herein described without departing from the scope provided herein.

Performance/Properties

As previously noted, the present invention enables the preparation of an improved detector, and more particularly an improved sensor for such a detector. Improved features of the present detector include the following:

1. Responsivity

While the responsivity value may vary depending upon a number of factors, including for example the sensor composition and the dopant employed, the following features are illustrative.

Generally speaking, emmissivities of the pixels or sensors of the present invention ranges from at least about 0.5 to less than about 1, from about 0.75 to about 0.95, or from about 0.8 to about 0.9, with values of at least about 0.8, 0.85, 0.9, 0.95 or more being most preferred for maximum IR radiation absorption (such as for long wavelengths). Additionally, thermal impedance of the bridge structure, which also may vary with bridge composition, in some embodiments is at least about $2 \times 10^5$ K/W, $3 \times 10^5$ K/W, $4 \times 10^5$ K/W, $5 \times 10^5$ K/W, $6 \times 10^5$ K/W or more, with optimum performance being achieved when thermal impedance is maximized (e.g., at least about $6.5 \times 10^5$ K/W in some embodiments).

Accordingly, for a given sensor or pixel of the present invention, responsivity, as determined by means common in the art, may range from greater than about 5000 V/W to less than about 15,000 V/W, or from about 6,500 V/W to less than about 10,500 V/W (assuming, for example, about a 5 volt source and about 5 microamps of current through the pixel).

In this regard it is to be noted that, particularly for higher responsivity values (e.g., about 7,500, 8,500 W/V, 9,500 W/V or more), that the pixels of the present invention are more sensitive than polysilicon detectors, while being more easily processed (in comparison for example to $VO_x$ detectors).

2. Temperature Coefficient of Resistivity

The present invention advantageously enables the preparation of detectors having strong, flexible sensors which have improved temperature coefficient of resistivity ("TCR") values, as compared to ion implanted-only sensors (see, e.g., U.S. Pat. Nos. 5,753,523 and 5,629,665 which are incorporated in their entirety herein by reference). More specifically, while the TCR values may vary (depending upon for example the polymer composition from which the sensor was derived, the dopant used, the concentration thereof, thickness of the amorphous layer of the sensor, etc.), typically these values range from at least about 1.5%/K to about 5%/K or more (e.g., about 2 to about 4.5%/K, or from about 2.5 to about 3.5%/K), with values of 3%/K, 3.5%/K, 4%/K, 4.5%/K or more being achieved for some embodiments.

In this regard it is to be noted that such values may be determined by means common in the art. For example, samples prepared in accordance with the present invention were evaluated by means of a four-pont resistivity system, wherein contacts to the samples were formed from about 100 angstroms of evaporated chromium followed by about 1000 angstroms of evaporated gold. Contact resistance for some samples (e.g., tellurium/PEEK-derived sensor), for example, was measured and found to be less than about 2.5% of the total resistance at any temperature, and near about 2.5% at room temperature. The temperature dependence was measured in a dark helium environment; for thermal equilibrium, temperature was controlled to better than about 100 mK. VI curves were produced at each set point temperature as measured by a calibrated platinum resistor.

For a tellurium/PEEK-derived sensor, it was found that a TCR of about 2.5%/K was obtained when the present process was carried out using an initial tellurium layer of about 150 angstroms thick, and a nitrogen ion beam at a dose of about $1 \times 10^{16}$ ions/cm$^2$ at 50 Kev.

3. Heat Capacity

Heat capacity of the sensor, or more specifically the bridge-structure, is generally a function of bridge mass and, therefore, can vary depending upon for example the composition of the polymer layer from which the sensor is derived. Typically, however, the heat capacity is less than about $5\times10^{-10}$ J/K or $4\times10^{-10}$ J/K, with values of about $3\times10^{-10}$ J/K, $2\times10^{-10}$ J/K or less being even more preferred.

4. Thermal Conductivity

The thermal conductivity across the thickness of the sensor, or more specifically the bridge-structure, can vary depending upon, for example, the composition of the polymer layer from which the sensor was derived. Typically, however, the thermal conductivity is at least about $5\times10^{-5}$ W/K, $7\times10^{-5}$ W/K, $9\times10^{-5}$ W/K or more (e.g., $1\times10^{-4}$ W/K, $5\times10^{-4}$ W/K or more), with higher internal thermal conductivities being even more preferred.

5. Thermal Time Constant (Bolometer)

For those applications wherein the detector of the present invention is utilized for a bolometer instrument, thermal time constant is also an important consideration. Generally speaking, the detectors of the present invention are significantly faster than existing polysilicon detectors as a result of the very thin bridge structure that can be formed. While preferably the thermal time constant will be minimized, in order to maximize the speed of the device, typically this value is less than about 25 microseconds, 20 microseconds, 15 microseconds, 10 microseconds or even 5 microseconds.

6. Uniformity/Fill Factor

As previously noted, the process of the present invention advantageously enables the preparation of an array of detectors, an array which is very uniform in terms of the properties of each pixel or sensor. More specifically, the present invention enables an array of significant dimension (as described above) to be prepared wherein the resistivity, or dopant concentration, of each pixel or sensor in the array varies by less than about 5%, 4%, 3%, 2%, 1%, 0.5%, or even 0.1%.

Also with respect to the array, it is to be noted that because the present process allows for the use of common photolithography or microlithography techniques to be employed, a significant portion of a given substrate can be covered by the pixels or sensors. Generally speaking, higher "fill factors" are preferred. However, competing with a high fill factor is the need to limit "cross-talk" between the pixels, which is achieved by increasing the distance or spacing between the pixels. Typically, however, the present invention enables the preparation of an array wherein these two considerations are optimized, fill factors ranging from about 75% to less than about 100% (based on the total substrate surface area), from about 85% to about 97%, or from about 90% to about 95%.

7. Resistivity

As previously noted, as compared to an ion implanted film (such as that disclosed in U.S. Pat. Nos. 5,629,665 and 5,753,523), the doped film of the present invention enables significantly reduced resistivity values to be obtained. More specifically, the sensor of the present invention enables a resistivity of less than about 20 Mohms/square to be obtained (e.g., less than about 15, 10 or even 5 Mohms/square). Such low surface resistivities act to increase the speed of the sensor and make the material easier to use in applications/instruments where the sensors are connected to current sensing FET amplifiers that require more current for better measurements.

Figure 7:
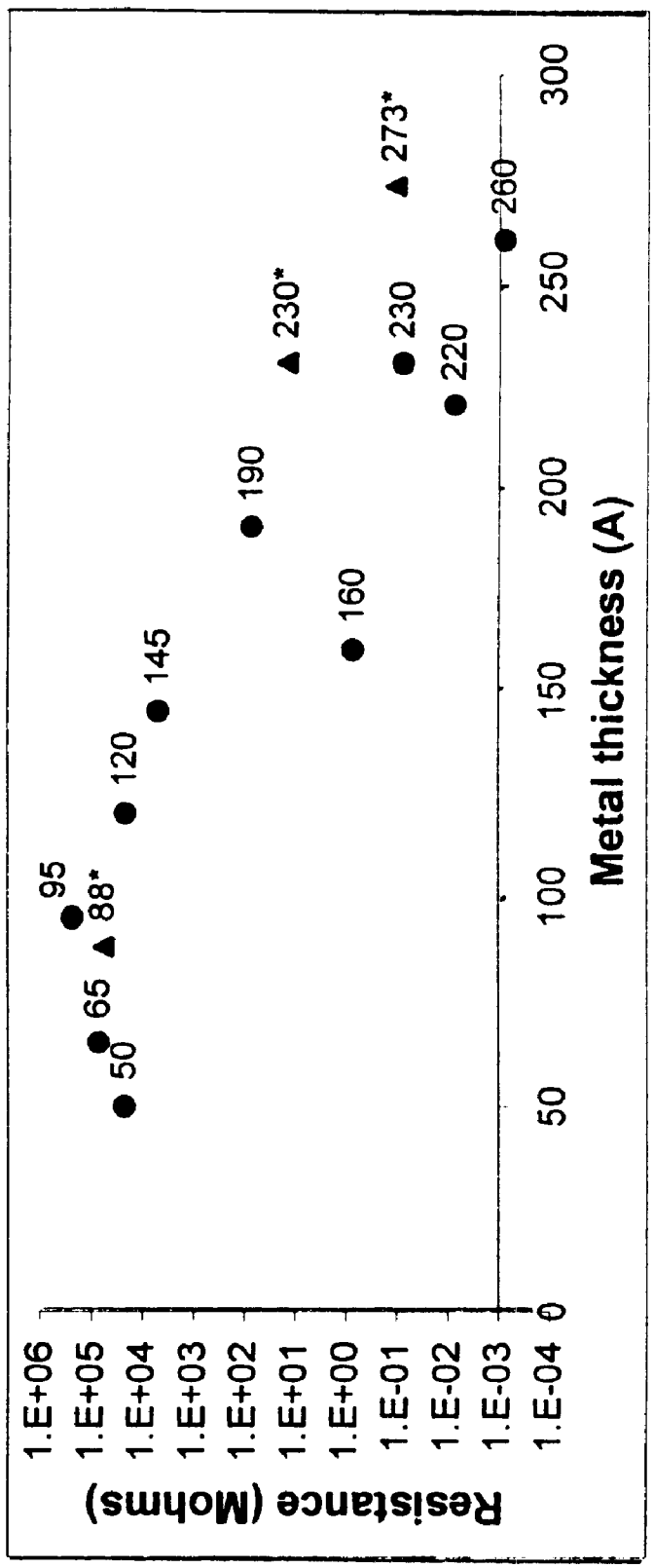
FIG. 7 generally illustrates the percolation behavior of the electrical resistance in a sensor prepared in accordance with one embodiment of the present invention, as a function of initial target (e.g., dopant) layer thickness.

It is to be noted that when ion implantation is utilized to prepare the amorphous layer of the sensor, the resulting resistivity is in part dependent upon the initial target dopant layer thickness. Referring now to FIG. 7, representative data is presented on the room temperature resistivity for a sensor of the present invention, derived from a PTFE polymer layer into which chromium was diffused by means of ion implantation, resistivity being shown as a function of initial chromium layer thickness. Here, the implantation process was performed by implanting 50 keV nitrogen ions to a dose of $1\times10^{16}$ ions/cm$^2$. For an initial chromium layer thickness of less than about 150 angstroms, the electrical resistivity in the film was found to be dominated by the depleted polymer structure (determined by means of comparing the resistivity of this film to the resistivity of essentially the same film, which was ion implanted under the same conditions but without a chromium layer, and finding the results to be the same). However, at a chromium layer thickness of greater than about 270 angstroms, conductivity was dominated by the connected metal clusters of the amorphous layer of the sensor, resulting in a resistivity that was roughly 9 orders of magnitude smaller. At a metal layer thickness of about 230 angstroms, the material was found to be unstable, as indicated by the large range of resistivity values obtained.

Based on this data, it was concluded the sensor, formed from an initial chromium layer thickness of about 230 angstroms under these conditions, was close to the percolation threshold. As the resistance percolates, it varies over 4 orders of magnitude and will be a strong but uniform function of temperature.

Figure 8:
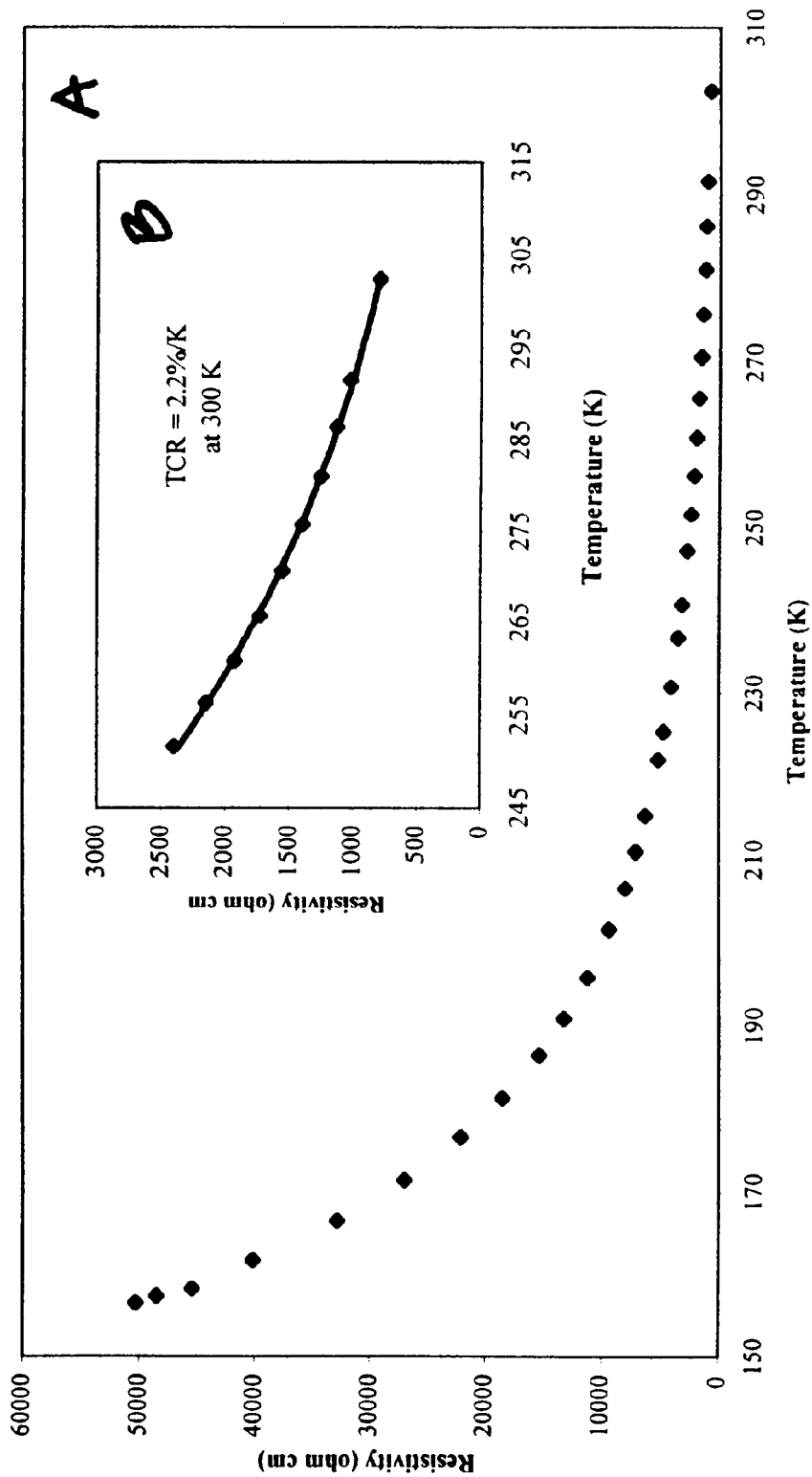
FIGS. 8A and 8B generally illustrate resistivity of a sensor of the present invention as a function of temperature down to about 150 K (8A) and at about room temperature (8B).

Referring now to FIGS. 8A and 8B, the dependence of resistivity on temperature for a tellurium/PEEK-derived sensor implanted with 50 keV nitrogen ions to a dose of $1\times10^{16}$ ions/cm$^2$, is illustrated. Here, the graphs illustrate resistivity as a function of temperature from about room temperature (graph 8B) to about 150 Kelvin (graph 8A). The initial thickness of the tellurium layer was about 200 angstroms, which was estimated to be beyond the percolation threshold by about 50 angstroms. This resulted in lower overall resistivity values being obtained. The thickness of the amorphous layer of the sensor after implantation was estimated to be about 700 angstroms (based on results of a TRIM simulation). The sensor was found to be uniform to better than 1% (i.e., resistivity varied by less than about 1% from pixel to pixel) and had a room temperature TCR of about 2.2%/K. Additionally, the sensor did not require any specialized handling; that is, it was found to be very strong and flexible (even after being repeatedly exposed to the atmosphere after the implantation process and cleaned with acetone prior to the deposition of metal contacts, without detrimental effects).

It is to be noted that, in comparison to an ion implanted only sensor (i.e., a process wherein the polymer layer is implanted without the presence of a target dopant layer thereon), the resistivity of the present ion beam mixed sensor is typically about 2 to 3 orders of magnitude lower.

It is to be further noted that the present process is an improvement over prior ion implanted only processes, because resistivity and responsivity in the present process can be controlled independently, and thus separately optimized. More specifically, in the present process, resistivity is controlled by controlling the concentration or content of the dopant (e.g., metal or metal-like nonmetal species) in the sensor, while responsivity is controlled by the implantation ion dose. In contrast, for an ion implantation only process, both resistivity and responsivity can only be controlled by ion dose.

8. Surface Adhesion

The impact ion implantation has on an interface between a substrate and a polymer layer, and the adhesive strength between the two as a result thereof, has generally been observed and studied. (See, e.g., N. Capps et al., *Tailoring Polymer Properties with Ion Beams*, Semiconductor International, July (2000).) It is believed that the implantation process of the present invention creates a similar result; namely, the formation of a non-uniform interface between (i) the amorphous layer of the sensor and the underlying layer (when present), and/or (ii) the amorphous layer of sensor and the substrate (when the thickness of the amorphous layer is about equal to the thickness of the sensor). As a result, the sensor strongly adheres to the substrate and/or the underlying layers. Additionally, because the entire sensor is fabricated from the same material, there are essentially no concerns about delamination or adhesion, particularly in the bridge area (which are common to multilayered structures).

9. Film Strength/Flexibility

The sensors of the present invention have a high resistance to abrasion and show little change upon exposure to moisture, solvents, acids or bases. In addition, the resistance generally does not change if exposed to chemicals which are solvents for the polymers from which the sensors were derived. This excellent solvent resistance also enables spin coating, exposure and patterning of photoresists, and the etching of underlying layers, all without changing the resistance.

The physical properties of the sensors, such as hardness, become similar to amorphous carbon or an inorganic material, while retaining sufficient flexibility to enable the formation of a bridge structure of considerable length and/or dimension. For example, in spite of the high degree of hardness/strength, the sensors can be patterned by lithography to form device features of a size less than about 2 microns.

In those instances wherein a portion of the initial polymer layer is unaffected by the process, the moisture, solvent and abrasion resistance, as well as the physical properties, of the resulting sensor can be a function of the underlying layer of unaffected polymer.

10. Magnetic Interference

With proper selection of the dopant, the detector of the present invention is unaffected by magnetic interferences, in part because of the organic nature of the sensor or bridge. For example, upon exposure to a magnetic field of about 10,000 gauss, a 1×1 inch sample of a tellurium/PEEK-derived sensor was found to exhibit a change in resistivity of less than about 5%, 3%, 1% or even 0.5%. This lack of magneto-resistance is an advantage over silicon diode temperature sensors, in part because it obviates the need for complex film arrangements (such as that described in U.S. Pat. No. 4,371,861).

Applications

It is to be noted that the present invention enables the preparation of infrared detectors which are well suited for a number of applications. The present invention is particularly advantageous over existing detectors, even those which employ conductive polymer films (see, e.g., U.S. Pat. No. 6,080,987), because the sensor of the present invention does not require or need an additional thermally sensitive element to "detect" the temperature change in the sensor which results upon absorption of infrared radiation;

that is, unlike existing technologies, which simply "read" the dielectric response of common inorganic materials (e.g., BST), the present invention employed a unique sensor which exhibits a dielectric response that is directly read. More specifically, in the present invention, IR radiation strikes or impacts the amorphous layer of the sensor, which then exhibits a property change (i.e., first a temperature change, and then a resistivity change as a result thereof) that is directly read or detected (by means of passing an electrical current through the sensor). In contrast, known devices which employ an IR absorbing polymer film still utilize a common metal or carbon-metal alloy sensor (i.e., an inorganic sensor), which detects a temperature change in the film and then in turn exhibits a resistivity change that is measured by means of passing an electrical current through the inorganic sensor.

The process of the present invention is further illustrated by the following Examples. These Examples are designed to teach those of ordinary skill in the art how to practice the present invention. Accordingly, they are not to be interpreted in a limiting sense.

EXAMPLES

Example 1

PTFE- and PEEK-derived Ion Beam Mixed Polymer Sensors

To illustrate that ion beam implantation, in conjunction with and the deposition of a target dopant layer on a polymer layer surface, can be used to form a conductive "ion beam mixed" layer, two samples were prepared. More specifically, for a first sample a copper layer (about 230 angstroms thick) was vacuum evaporated onto the surface of a self-standing PTFE polymer film (about 1 mm thick), while for a second a tellurium layer (about 175 angstroms thick) was vacuum evaporated onto the surface of a self-standing PEEK polymer film (about 100 microns thick). No substrates were used for these samples. After the copper and tellurium layers were deposited on the respective PTFE and PEEK polymer films, both samples were implanted using about 50 keV and 150 microamps to a dose of about $1 \times 10^{16}$ nitrogen ions/cm$^2$. These conditions were sufficient to result in the formation of an amorphous layer in the sensor of a thickness of about 700 to 2000 angstroms, the peak copper or tellurium concentration (about 55 atomic percent and 35 atomic percent, respectively) being at a depth of about 350 angstroms. A second portion of the initial polymer film (i.e., a layer below the doped, amorphous layer) was ion implanted (i.e., nitrogen-containing, but substantially-free of copper or tellurium), with the remaining portion (i.e., a third layer) being substantially-free of both the implantation species (i.e., nitrogen) and copper or tellurium.

Following the implantation process, electrical contacts were vacuum evaporated onto the surface of the sensor. More specifically, 100 angstroms of chromium, followed by 1000 angstroms of gold, were vacuum evaporated onto the amorphous layer of the sensor. The resistance of the resulting sensors was measured and found to be about 160 Mohms/square (Cu/PTFE-derived) and about 228 Mohms/square (Te/PEEK-derived), while the temperature coefficient of resistivity (TCR) was found to be about 1.7%/K (Cu/PTFE-derived) and 3.9%/K (Te/PEEK-derived).

Example 2

Preparation of PSA-derived Ion Beam Mixed Polymer Sensor

The same process as described above was repeated here, except that a PSA polymer film (about 3000 angstroms thick) was first deposited on the surface of a silicon oxide substrate wafer. A chromium layer (about 230 angstroms thick) was then vacuum evaporated on the polymer layer surface. Following formation of the electrical contacts, as described above, the resistance of the sensor was measured and found to be about 55 Mohms/square, while the TCR was found to be about 3.5%/K.

In view of the above, it will be seen that the several objects of the invention are achieved. As various changes could be made in the above material and processes without departing from the scope of the invention, it is intended that all matter contained in the above description be interpreted as illustrative and not in a limiting sense.

What is claimed is:

1. An infrared detector comprising:
    a substrate;
    a sensor having a segment thermally isolated from the substrate and a resistivity which varies as a function of temperature, the segment comprising an amorphous layer containing organic carbon and a dopant, the concentration of the dopant in the amorphous layer being at least about $1 \times 10^{20}$ atoms/cm$^3$, the dopant being aluminum, an element having an atomic number greater than 18, or a mixture thereof; and,
    contacts electrically connected to the segment, the segment being energizable via said contacts.

2. The detector of claim 1 wherein the concentration of the dopant in the amorphous layer is at least about $1 \times 10^{21}$ atoms/cm$^3$.

3. The detector of claim 1 wherein the concentration of the dopant in the amorphous layer is at least about $1 \times 10^{22}$ atoms/cm$^3$.

4. The detector of claim 1 wherein the dopant is selected from silver, gold, copper, chromium, strontium, lead, tin, indium, cadmium, bismuth, antimony, zinc, thallium, germanium, gallium, tellurium, arsenic or a mixture thereof.

5. The detector of claim 4 wherein the dopant is selected from copper, chromium, silver, tellurium or a mixture thereof.

6. The detector of claim 1 wherein the organic carbon of the amorphous layer is derived from an organic polymer selected from a substituted or unsubstituted vinyl polymer, polyether, polyamide, polyimide, polyester or copolymer thereof.

7. The detector of claim 6 wherein the polymer is a substituted or unsubstituted vinyl polymer selected from polystyrene, polyacrylonitrile or copolymer thereof.

8. The detector of claim 6 wherein the polymer is poly(etheretherketone) and the dopant is tellurium.

9. The detector of claim 1 further comprising readout or processing circuitry disposed between the sensor and the substrate and in electrical contact with the sensor.

10. The detector of claim 1 wherein the substrate is selected from the group consisting of non-conductive, inorganic insulators and polymers.

11. The detector of claim 10 wherein the substrate is a non-conductive, inorganic insulator selected from the group consisting of glass, quartz, aluminum oxide, silicon dioxide and silicon nitride.

12. The detector of claim 10 wherein the substrate is a non-conductive polymer selected from the group consisting of polyimides, polyesters and halogenated vinyl polymers.

13. The detector of claim 1 wherein the substrate is a metal or semiconductor, the detector further comprising an insulating layer disposed between the substrate and the sensor.

14. The detector of claim 1 wherein the thermally isolated segment of the sensor is spaced from and above the substrate surface, forming a bridge there over.

15. The detector of claim 1 wherein, at the bridge apex, the distance between the bottom of the sensor and the substrate is about one-quarter the wavelength of the infrared radiation to be detected.

16. The detector of claim 15 wherein said infrared radiation has a wavelength ranging from about 1 to about 3 micrometers.

17. The detector of claim 15 wherein said infrared radiation has a wavelength ranging from about 3 to about 5 micrometers.

18. The detector of claim 15 wherein said infrared radiation has a wavelength ranging from about 8 to about 14 micrometers.

19. The detector of claim 1 wherein the sensor has an average emmisivity ranging from greater than about 0.75 to less than about 0.95.

20. The detector of claim 1 wherein the sensor has a temperature coefficient of resistivity of at least about 2%/K at room temperature.

21. The detector of claim 1 wherein the detector is a bolometer, said bolometer detector having a thermal time constant of less than about 20 microseconds.

22. The detector of claim 1 wherein the sensor has a responsivity of at least about 5000 V/W.

23. The detector of claim 1 wherein the sensor has a resistivity of less than about 20 Mohms/square.

24. The detector of claim 1 wherein an array of said sensors are present on the substrate surface, each sensor having contacts electrically connected to the sensor segment.

25. The focal plane array detector of claim 24 wherein the array comprises at least about a 480×640 configuration of sensor on the substrate.

26. The focal plane array detector of claim 25 wherein the resistivity of each sensor in the array differs by less than about 2%.

27. The focal plane array detector of claim 25 wherein the array has a fill factor ranging from about 90% to about 95%.

28. An infrared detector comprising:
    a substrate;
    a sensor having a segment thermally isolated from the substrate and a resistivity which varies as a function of temperature, the segment comprising an amorphous layer containing organic carbon and a dopant, the sensor having a responsivity of at least about 5000 V/W; and,
    contacts electrically connected to the segment, the segment being energizable via said contacts.

29. The detector of claim 28 wherein the responsivity ranges from about 6,500 to less than about 10,500 V/W.

30. The detector of claim 28 wherein the concentration of the dopant in the amorphous layer is at least about $1 \times 10^{21}$ atoms/cm$^3$.

31. The detector of claim 30 wherein the dopant is selected from copper, chromium, silver, tellurium or a mixture thereof.

32. The detector of claim 28 wherein the organic carbon of the amorphous layer is derived from an organic polymer selected from a substituted or unsubstituted vinyl polymer, polyether, polyamide, polyimide, polyester or copolymer thereof.

33. The detector of claim 32 wherein the polymer is poly(etheretherketone) and the dopant is tellurium.

34. The detector of claim 28 wherein the sensor has a temperature coefficient of resistivity of at least about 2%/K at room temperature.

35. The detector of claim 28 wherein an array of said sensors are present on the substrate surface, each sensor having contacts electrically connected to the sensor segment, the resistivity of each sensor in the array differing by less than about 2%.

36. An infrared detector comprising:
    a substrate;
    a sensor having a segment thermally isolated from the substrate and a resistivity which varies as a function of temperature, the segment comprising an amorphous layer containing organic carbon and a dopant, the sensor having a temperature coefficient of resistivity of at least about 2%/K; and, contacts electrically connected to the segment, the segment being energizable via said contacts.

37. The detector of claim 36 wherein the temperature coefficient of resistivity ranges from about 2%/K to about 4.5%/K at room temperature.

38. The detector of claim 36 wherein the responsivity is at least about 5000 V/W.

39. The detector of claim 36 wherein the concentration of the dopant in the amorphous layer is at least about $1\times10^{21}$ atoms/cm$^3$.

40. The detector of claim 39 wherein the dopant is selected from copper, chromium, silver, tellurium or a mixture thereof.

41. The detector of claim 36 wherein the organic carbon of the amorphous layer is derived from an organic polymer selected from a substituted or unsubstituted vinyl polymer, polyether, polyamide, polyimide, polyester or copolymer thereof.

42. The detector of claim 41 wherein the polymer is poly(etheretherketone) and the dopant is tellurium.

43. The detector of claim 36 wherein an array of said sensors are present on the substrate surface, each sensor having contacts electrically connected the sensor segment, the resistivity of each sensor in the array differing by less than about 2%.

44. An infrared detector comprising:

a substrate;

a sensor having a segment thermally isolated from the substrate and a resistivity which varies as a function of temperature, the segment comprising an ion beam mixed layer containing organic carbon and a dopant other than carbon, the concentration of the dopant in the ion beam mixed layer being at least about $1\times10^{20}$ atoms/cm$^3$, the ion beam mixed layer being formed by ion beam mixing of a target layer and an organic layer wherein the target layer comprises a source of the dopant; and, contacts electrically connected to the segment, the segment being energizable via said contacts.

45. The detector of claim 44 wherein the dopant in the ion beam mixed layer is p-type, n-type, a metal or a mixture thereof.

46. The detector of claim 44 wherein the concentration of the dopant in the ion beam mixed layer is at least about $1\times10^{21}$ atoms/cm$^3$.

47. The detector of claim 44 wherein the dopant is selected from silver, gold, copper, chromium, strontium, lead, tin, indium, cadmium, bismuth, antimony, zinc, thallium, germanium, gallium, tellurium, arsenic, aluminum, lithium, manganese or a mixture thereof.

48. The detector of claim 47 wherein the dopant is selected from copper, chromium, silver, tellurium or a mixture thereof.

49. The detector of claim 44 wherein the organic carbon of the amorphous layer is derived from an organic polymer selected from a vinyl polymer, a polyether, a polyamide, a polyimide, a polyester or copolymer thereof.

50. The detector of claim 44 wherein the sensor has a temperature coefficient of resistivity of at least about 2%/K at room temperature.

51. The detector of claim 44 wherein the sensor has a responsivity of at least about 5000 V/W.

52. The detector of claim 44 wherein an array of said sensors are present on the substrate surface, each sensor having contacts electrically connected the sensor segment, the resistivity of each sensor in the array differing by less than about 2%.

53. A process for detecting infrared radiation, the process comprising:

passing an electrical current through a sensor of an infrared detector, the sensor having a segment thermally isolated from a substrate of the detector and a resistivity which varies as a function of temperature, the segment comprising an amorphous layer containing organic carbon and a dopant, the concentration of the dopant in the amorphous layer being at least about $1\times10^{20}$ atoms/cm$^3$, the dopant being aluminum, an element having an atomic number greater than 18, or a mixture thereof; and, detecting a resistivity change in the sensor caused by the absorption of heat from infrared radiation impinging the sensor.

54. The process of claim 53 wherein the concentration of the dopant in the amorphous layer is at least about $1\times10^{21}$ atoms/cm$^3$.

55. The process of claim 53 wherein the dopant is selected from silver, gold, copper, chromium, strontium, lead, tin, indium, cadmium, bismuth, antimony, zinc, thallium, germanium, gallium, tellurium, arsenic or a mixture thereof.

56. The process of claim 55 wherein the dopant is selected from copper, chromium, silver, tellurium or a mixture thereof.

57. The process of claim 53 wherein the organic carbon of the amorphous layer is derived from an organic polymer selected from a vinyl polymer, a polyether, a polyamide, a polyimide, a polyester or copolymer thereof.

58. The process of claim 53 wherein the thermally isolated segment of the sensor is spaced from and above the substrate surface, wherein the thermally isolated segment of the sensor forms a bridge.

59. The process of claim 53 wherein, at the bridge apex, the distance between the bottom of the sensor and the substrate is about one-quarter the wavelength of the infrared radiation to be detected.

60. The process of claim 59 wherein said infrared radiation has a wavelength ranging from about 1 to about 3 micrometers.

61. The process of claim 59 wherein said infrared radiation has a wavelength ranging from about 3 to about 5 micrometers.

62. The process of claim 59 wherein said infrared radiation has a wavelength ranging from about 8 to about 14 micrometers.

63. The process of claim 53 wherein the detection of a resistivity change occurs at room temperature.

64. The process of claim 53 wherein the sensor has a temperature coefficient of resistivity of at least about 2%/K at room temperature.

65. The process of claim 53 wherein said sensor has a responsivity of at least about 5,000 V/W.

66. A process for preparing an infrared detector, the process comprising:

forming an organic layer on a substrate;

forming a target layer comprising a dopant on the organic layer; and, contacting the target layer with an ion beam to form an infrared sensor on the substrate, the sensor having a segment thermally isolated from the substrate and a resistivity which varies as a function of temperature, the segment comprising an ion beam mixed layer containing organic carbon derived from the organic layer and a dopant other than carbon from the target layer, the concentration of the dopant in the ion beam mixed layer being at least about $10^{20}$ atoms/cm$^3$.

67. The process of claim 66 further comprising, prior to said organic layer formation, forming an insulating layer on the substrate.

68. The process of claim 67 further comprising forming readout or processing circuitry, said circuitry being disposed between the insulating layer and the organic layer.

69. The process of claim 68 further comprising forming electrical current supplying and receiving pathways, said pathways being disposed between the circuitry and the organic layer and comprising gold, nickel, copper, titanium, tungsten or a mixture thereof.

70. The process of claim 66 further comprising forming an array of discrete regions of the sensor on the substrate.

71. The process of claim 70 further comprising forming electrical current supplying and receiving pathways to each sensor in the array.

72. The process of claim 70 wherein thermal isolation of the segment of each sensor in the array is achieved by etching a portion of the substrate beneath each segment to form an absorption cavity, each segment being. spaced from and above the cavity.

73. The process of claim 72 wherein the array comprises at least about a 480×640 configuration of sensors.

74. The process of claim 73 wherein the resistivity of each sensor in the array differs by less than about 2%.

75. The process of claim 73 wherein the array has a fill factor ranging from about 90% to about 95%.

76. The process of claim 66 wherein the dopant in the ion beam mixed layer is p-type, n-type, a metal or a mixture thereof.

77. The process of claim 66 wherein the concentration of the dopant in the ion beam mixed layer is at least about $1\times10^{21}$ atoms/cm$^3$.

78. The process of claim 66 wherein the dopant is selected from silver, gold, copper, chromium, strontium, lead, tin, indium, cadmium, bismuth, antimony, zinc, thallium, germanium, gallium, tellurium, arsenic, aluminum, manganese, lithium or a mixture thereof.

79. The process of claim 78 wherein the dopant is selected from copper, chromium, silver, tellurium or a mixture thereof.

80. The process of claim 66 wherein the organic layer is an organic polymer layer, the polymer being selected from a vinyl polymer, a polyether, a polyamide, a polyimide, a polyester or copolymer thereof.

81. The process of claim 66 wherein the sensor has a temperature coefficient of resistivity of at least about 2%/K at room temperature.

82. The process of claim 66 wherein the sensor has a responsivity ranging from at least about 5,000 to less than about 15000 V/W.

83. The process of claim 66 wherein the ion beam dose ranges from about $1\times10^{14}$ ions/cm$^2$ to about $1\times10^{17}$ ions/cm$^2$.

84. The process of claim 66 wherein the ion beam energy ranges from about 25 to about 100 KeV.

* * * * *